(12) United States Patent
Tonda

(10) Patent No.: US 7,349,276 B2
(45) Date of Patent: Mar. 25, 2008

(54) READOUT CIRCUIT AND NONVOLATILE SEMICONDUCTOR MEMORY DEVICE

(75) Inventor: Yasuhiro Tonda, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 15 days.

(21) Appl. No.: 11/303,953

(22) Filed: Dec. 19, 2005

(65) Prior Publication Data

US 2006/0133171 A1 Jun. 22, 2006

(30) Foreign Application Priority Data

Dec. 22, 2004 (JP) ............................. 2004-372009

(51) Int. Cl.
*G11C 7/02* (2006.01)
(52) U.S. Cl. ............... 365/210; 365/185.2; 365/189.05; 365/194
(58) Field of Classification Search ................ 365/210, 365/185.2, 189.05, 194
See application file for complete search history.

(56) References Cited

U.S. PATENT DOCUMENTS 5,841,719 A * 11/1998 Hirata ..................... 365/210

6,473,343 B2 * 10/2002 Ohba et al. ............. 365/189.07
2003/0156478 A1 * 8/2003 Maruyama et al. ......... 365/200

FOREIGN PATENT DOCUMENTS

| JP | 02-049519 | 10/1990 |
|---|---|---|
| JP | 09-320283 | 12/1997 |
| JP | 2001-229686 | 8/2001 |
| JP | 2004-030754 | 1/2004 |

* cited by examiner

*Primary Examiner*—Pho M. Luu
(74) *Attorney, Agent, or Firm*—Young & Thompson

(57) ABSTRACT

A readout circuit has: a sense amplifier circuit configured to sense a data stored in a memory cell transistor based on a current flowing through the memory cell transistor and a reference current flowing through a dummy cell transistor; and a voltage control circuit configured to apply a first voltage to a gate of the dummy cell transistor in a read operation. The memory cell transistor has a control gate and a floating gate. The voltage control circuit sets the first voltage such that a voltage between the gate and a source of the dummy cell transistor is lower than a voltage between the control gate and a source of the memory cell transistor.

13 Claims, 17 Drawing Sheets

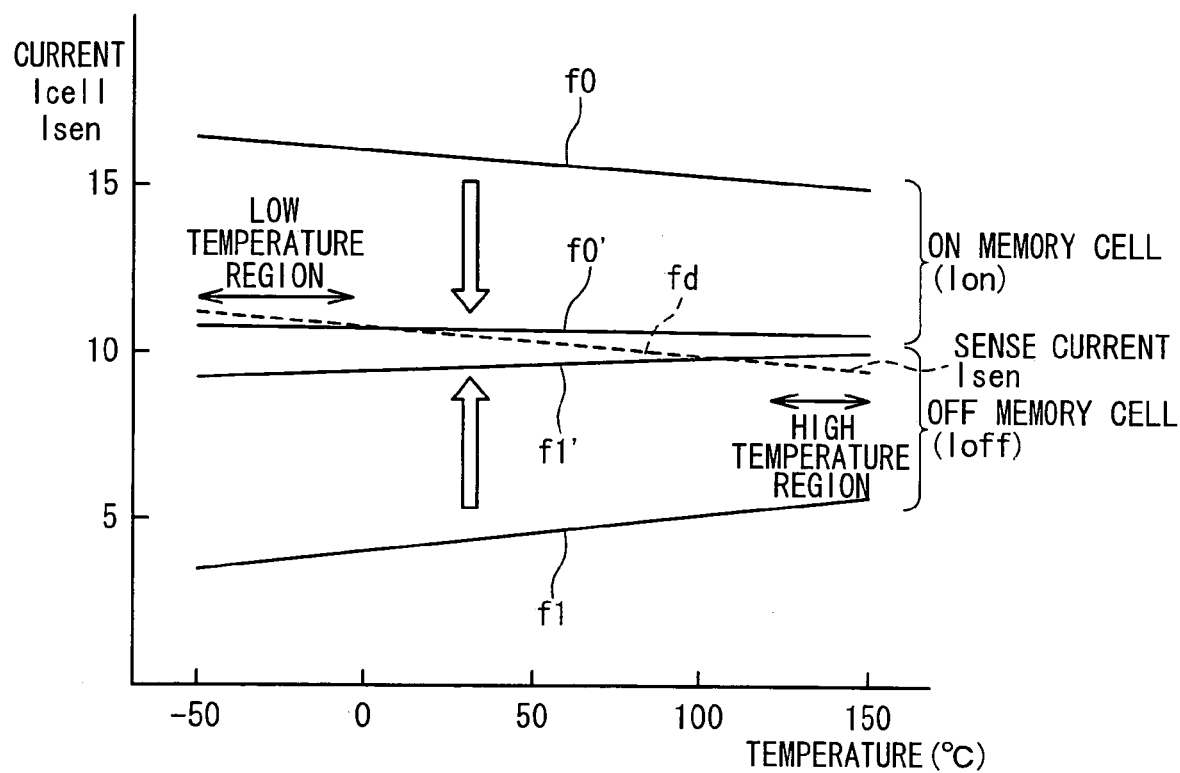

10: MEMORY CELL

20; DUMMY CELL

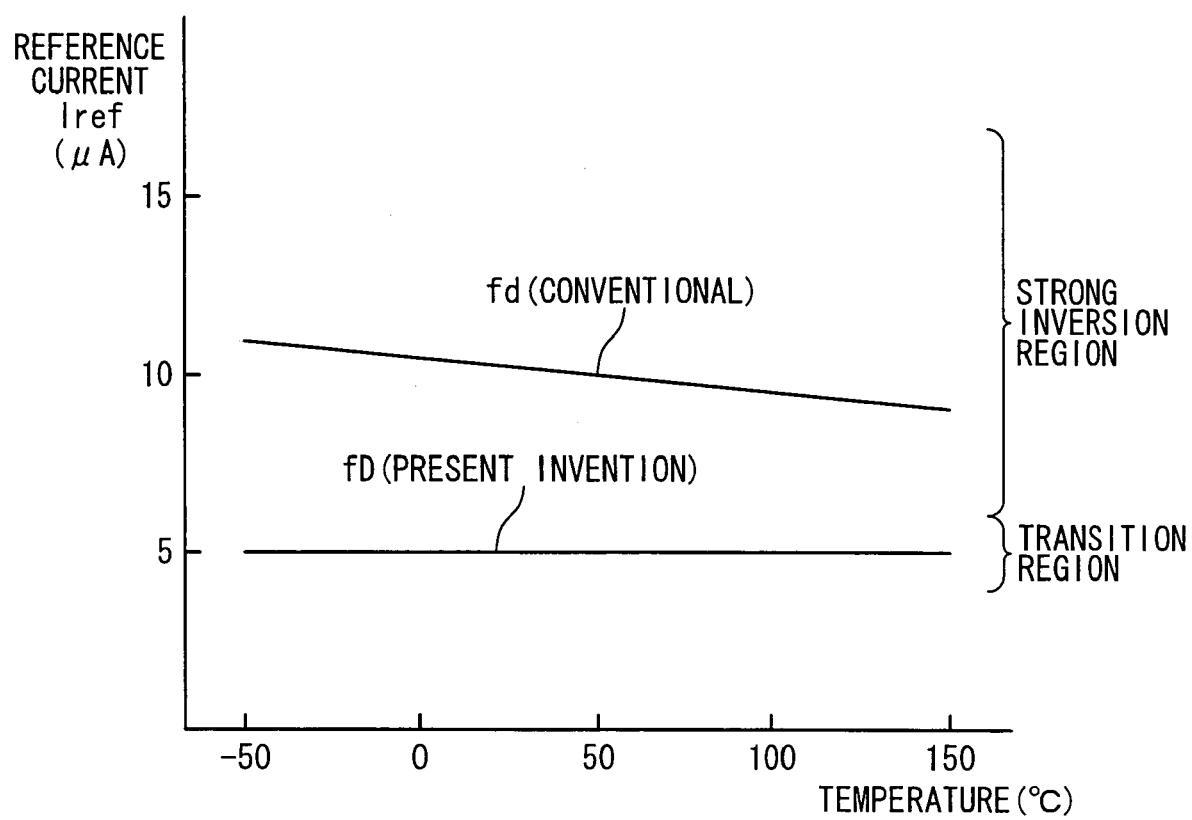

READOUT CIRCUIT AND NONVOLATILE SEMICONDUCTOR MEMORY DEVICE

BACKGROUND OF THE INVENTION

1. Field of the Invention

The present invention relates to a readout circuit used for reading out data stored in a memory cell of a nonvolatile semiconductor memory device.

2. Description of the Related Art

In Japanese Laid Open Patent Application JP-B-Heisei 02-049519, a readout circuit used for reading out data stored in a memory cell of a semiconductor memory device is disclosed. FIG. 1 is a circuit diagram showing a configuration of a nonvolatile semiconductor memory device to which the readout circuit mentioned above is applied. The nonvolatile semiconductor memory device 100 is provided with a memory cell 110 and a readout circuit 130 for sensing a data stored in the memory cell 110. The readout circuit 130 includes a dummy cell 120, a current sense amplifier circuit 140 and a reference current circuit 150.

The memory cell 110 is a stacked gate type N-channel transistor, and includes a control gate and a floating gate. The dummy cell 120 has almost the same structure as the memory cell 110. However, the control gate and the floating gate of the dummy cell 120 are shorted with each other. When electrons (e.g. hot electrons) are injected into the floating gate of the memory cell 110, a threshold voltage of the memory cell 110 is changed. The threshold voltage becomes higher when electrons are injected into the floating gate, while becomes lower when electrons are drawn out of the floating gate. The nonvolatile semiconductor memory device such as a flash memory stores data by utilizing such a change in characteristics.

With regard to the stacked gate type memory cell transistor, a drain current flows when a voltage higher than the threshold voltage is applied to the control gate. The state mentioned above is referred to as an operation in a "strong inversion region". The drain current Id of a general MOS transistor in the "strong inversion region" is expressed by the following equation:

$$I_d = \frac{W}{L}\mu C_{ox}\left[(V_g - V_t)V_d - \frac{1}{2}V_d^2\right] \quad (1)$$

Here, Vg is a gate-source voltage (Vgs), Vd is a drain-source voltage (Vds), and Vt is the threshold voltage. The parameters W and L are a gate width and a gate length of the MOS transistor, respectively. The parameter μ is an average surface mobility, and Cox is a gate capacitance per unit area. Especially when the drain-source voltage Vd is small (for example, 1 V or less), the drain current Id is expressed by the following equation:

$$I_d = \frac{W}{L}\mu C_{ox}(V_g - V_t)V_d \quad (2)$$

FIG. 2 shows IV characteristics of the memory cell 110 and the dummy cell 120, in the nonvolatile semiconductor memory device 100. In FIG. 2, a vertical axis indicates the drain current Id, while a horizontal axis indicates a voltage Vcg applied to the control gate. Here, as shown in FIG. 1, sources of the memory cell 110 and the dummy cell 120 are connected to a ground. Therefore, the control gate voltage Vcg in FIGS. 1 and 2 can be considered to represent the gate-source voltage Vg mentioned above. The memory cell 110 in which electrons are injected into the floating gate is referred to as an "OFF memory cell" hereinafter. On the other hand, the memory cell 110 in which electrons are drawn out of the floating gate is referred to as an "ON memory cell" hereinafter. The ON memory cell corresponds to an erase memory cell from which the electrons are erased, and is related to a data value "0" for example. On the other hand, the OFF memory cell corresponds to a program memory cell, and is related to the data value "1" for example. The threshold voltages of the ON memory cell and the OFF memory cell are Vt0 and Vt1, respectively.

As expressed in the above equation (2) and shown in FIG. 2, the drain current Id is almost proportional to the control gate voltage Vcg (the gate-source voltage Vg) in the strong inversion region. A proportional coefficient (changing rate of the drain current Id to the change in the control gate voltage Vcg) of the dummy cell 120 is set to be smaller than that of the memory cell 110. It should be noted that the proportional coefficient can be adjusted by changing the gate capacitance Cox, the gate width W, and the gate length L. The threshold voltage Vtd of the dummy cell 120 is lower than the threshold voltage Vt0 of the ON memory cell, because potentials of the control gate and the floating gate of the dummy cell 120 are the same. Therefore, the IV characteristic of the dummy cell 120 is as indicated by a line in FIG. 2.

In a read operation, the same control gate voltage Vcg is applied to the control gates of the memory cell 110 and the dummy cell 120 having such IV characteristics. The voltage applied at the time of the read operation is referred to as a "read voltage VR" hereinafter. As shown in FIG. 2, the read voltage VR is set between the threshold voltages Vt0 and Vt1. Therefore, in the read operation, the ON memory cell operates in the strong inversion region and a drain current (a read current) Ion flows through the ON memory cell. Also, the dummy cell 120 operates in the strong inversion region and a drain current (a reference current) Iref flows through the dummy cell 120.

Here, the read voltage VR is lower than the threshold voltage Vt1 of the OFF memory cell. Therefore, the OFF memory cell does not operate in the strong inversion region. However, that's not to say that no electric current flows through the OFF memory cell at all. In an actual MOS transistor, a minute electric current flows when a potential difference exists between the source and the drain, even if the gate voltage is equal to or less than the threshold voltage. The cause is as follows: Some electrons exist near the surface of a substrate beneath the gate, though the electron density is not high. Therefore, a minute electric current can flow when the electrons mentioned above are carried in the substrate to the drain side due to diffusion. Such a state is referred to as an operation in a "weak inversion region". The drain current Id of a general MOS transistor in the "weak inversion region" is expressed by the following equation:

$$I_d = I_d^0 \exp\frac{qV_g}{mk_B T}\left[1 - \exp\left(-\frac{qV_d}{k_B T}\right)\right] \quad (3)$$

Here, q, $k_B$, T and m are quantity of electric charge, the Boltzmann constant, an absolute temperature and a predetermined parameter, respectively. Also, Vg is a gate-source voltage (Vgs), and Vd is a drain-source voltage (Vds). As shown in FIG. 2, a small drain current Ioff flows through the OFF memory cell as well, when the read voltage VR is applied to the control gate. In the nonvolatile semiconductor memory device 100, whether a memory cell 110 is an ON memory cell or an OFF memory cell is sensed by comparing a current Icell (Ion, Ioff) from the memory cell 110 and the reference current Iref from the dummy cell 120.

Detailed configuration and operation of the nonvolatile semiconductor memory device 100 are as follows. As shown in FIG. 1, the current sense amplifier circuit 140 is provided with a PMOS 141, a PMOS 142, an NMOS 143, an NMOS 144 and an NOR 145. The PMOSs 141 and 142 constitute a current mirror circuit. The NOR 145 turns off the NMOS 143 in response to a stop signal Stop and thereby prevents electric currents from flowing when unnecessary. The reference current circuit 150 is provided with a PMOS 151, a PMOS 152, an NMOS 153, an NMOS 154 and an NOR 155. The PMOSs 151 and 152 constitute a current mirror circuit. The NMOSs 144 and 153 also constitute a current mirror circuit. The NOR 155 turns off the NMOS 154 in response to a stop signal Stop and thereby prevents electric currents from flowing when unnecessary. The PMOSs 141, 142, 151 and 152 have the same size. The NMOSs 143 and 154 have the same size. The NMOSs 144 and 153 have the same size. Also, transistors constituting the NORs 145 and 155 all have the same size.

In a read operation, the same read voltage VR is applied to the control gates of the memory cell 110 and the dummy cell 120. At this time, a memory cell current Icell (Ion, Ioff) flows through the memory cell 110 in accordance with a stored data. The memory cell current Icell also flows through the PMOS 141. Since the PMOSs 141 and 142 constitute the current mirror circuit and have the same transistor size, a current flowing through the PMOS 142 is also the memory cell current Icell.

On the other hand, the reference current Iref (e.g. 10 µA) flows through the dummy cell 120. At this time, the reference current Iref also flows through the PMOS 152. Since the PMOSs 151 and 152 constitute the current mirror circuit and have the same transistor size, the current flowing through the PMOS 151 is also the reference current Iref. Consequently, the reference current Iref also flows through the NMOS 153. Similarly, since the NMOSs 144 and 153 constitute the current mirror circuit and have the same transistor size, the current flowing through the NMOS 144 is also the reference current Iref. The current flowing through the NMOS 144 is used for sensing the data stored in the memory cell 110, and is referred to as a "sense current Isen" hereinafter.

In a case when the memory cell 110 is an ON memory cell (data value: 0), namely, when the memory cell current Icell is a read current Ion, as shown in FIG. 2, the read current Ion is larger than the sense current Isen (the reference current Iref). In this case, voltage at a connection point O1 in FIG. 1 is increased up to near a power supply voltage VDD. As a result, a logical value "Low" is output from an output OUT through an inverter 131 connected to the connection point O1. On the other hand, in a case when the memory cell 110 is an OFF memory cell (data value: 1), namely, when the memory cell current Icell is a read current Ioff, the read current Ioff is smaller than the sense current Isen (the reference current Iref), as shown in FIG. 2. In this case, voltage at the connection point O1 in FIG. 1 is decreased down to near a ground voltage GND, and a logical value "Hi" is output from the output OUT. As described above, when a relation "Ion>Iref>Ioff" is satisfied, the read operation is carried out normally.

The following techniques are also known as related arts.

Japanese Laid Open Patent Application JP-A-Heisei 09-320283 discloses a technique whose object is to match between a rise voltage (a gate voltage with which a current begins to flow) of a dummy cell and that of a memory cell. A nonvolatile semiconductor memory device described in the document has: a memory cell consisting of a stacked gate type NMOS; a dummy cell consisting of a single gate type NMOS; first and second capacitance elements; and a differential amplification sense amplifier. The first and second capacitance elements are connected in series between a power supply and a ground. A capacitance ratio between the first and second capacitance elements is approximately the same as that of the cell transistors. Potential at a connection point between the first and second capacitance elements is supplied to a gate of the dummy cell transistor. The differential amplification sense amplifier compares a read voltage from the memory cell side and a reference voltage from the dummy cell side.

Japanese Laid Open Patent Application JP-P2001-229686A discloses a technique whose object is to ensure a correct read operation even if temperature and manufacturing process conditions are changed. A nonvolatile semiconductor memory device described in the document has a memory cell transistor, a reference transistor, a differential sense amplifier, and a gate voltage generating circuit that generates a gate voltage of the reference transistor. The gate voltage generating circuit is provided with a dummy cell transistor having the same structure as the memory cell transistor; a current mirror for generating an electric current proportional to a drain current of the dummy cell transistor; and a transistor means for generating the gate voltage of the reference transistor based on the generated electric current.

Japanese Laid Open Patent Application JP-P2004-030754A discloses a technique whose object is to set a reference current value with a high precision and a short period of time. A nonvolatile semiconductor memory device described in the document is provided with a differential amplifier circuit and an external terminal. The differential amplifier circuit sets a drain-source voltage of a dummy cell to a first reference voltage which depends on a power supply voltage, and controls a gate potential of the dummy cell with a second reference voltage which does not depend on the change in the power supply voltage. A reference current flowing through the dummy cell in response to a read control signal is output from the external terminal. On the basis of the current value output from the external terminal, the second reference voltage is adjusted and thereby the value of the reference current is corrected.

SUMMARY OF THE INVENTION

FIG. 3A shows temperature dependence of the drain current of the memory cell 110 in FIG. 1. In FIG. 3A, the vertical axis indicates the drain current Id (the memory cell current Icell), and the horizontal axis indicates the temperature. Applied to the control gate of the memory cell 110 is 3.0 V, for example. In the "strong inversion region" mentioned above, the drain current Id is formed by electrons which is majority carriers. The electrons move from the source toward the drain in an inversion layer beneath the gate. The mobility of the electrons is determined by phonon scattering. As the temperature rises, the phonon scattering becomes stronger and hence the mobility of the electrons is decreased. That is, the drain current Id decreases with increasing temperature in the strong inversion region. Thus, the read current Ion of the ON memory cell has a characteristic indicated by a function f0 in FIG. 3A.

On the other hand, as expressed by the above-mentioned equation (3), the drain current Id in the "weak inversion region" increases exponentially as the gate-source voltage Vg is increased, but hardly depends on the drain-source voltage Vd. That is because carrier density (electron density) in a channel is low in a case of the weak inversion region and the drain current Id is determined by the number of electrons overcoming a potential barrier between the source and a weak inversion layer. When the temperature rises, the number of electros overcoming the potential barrier between the source and the weak inversion layer is increased. Therefore, the drain current Id increases with increasing temperature in the weak inversion region. Thus, the read current Ioff of the OFF memory cell has a characteristic indicated by a function f1 in FIG. 3A.

FIG. 3B shows temperature dependence of the drain current of the dummy cell 120. In FIG. 3B, the vertical axis indicates the reference current (dummy cell current) Iref, and the horizontal axis indicates the temperature. Applied to the control gate of the dummy cell 120 is 3.0 V, for example. As mentioned above, the dummy cell 120 operates in the strong inversion region and thus has a similar characteristic to that indicated by the function f0 in FIG. 3A. That is, the reference current Iref of the dummy cell 120 has a characteristic indicated by a function fd in FIG. 3B.

The inventor of the present invention noticed a problem that temperature characteristic of the nonvolatile semiconductor memory device at the time of the read operation is deteriorated due to change over time (secular variation) of the characteristic of the memory cell 110.

With regard to a nonvolatile semiconductor memory device, when the memory cell 110 is used for a long period, its characteristic changes over time. The reason is as follows. The memory cell 110 of the nonvolatile semiconductor memory device has a floating gate that stores electrons. For example, there may be a case where electrons are trapped within an insulating film surrounding the floating gate. In this case, the trapped electrons may move into the floating gate when the ON memory cell (the erase memory cell) is used over a long period of time. Also, electrons may leak from the floating gate when the OFF memory cell (the program memory cell) is used over a long period of time. Further, in a case when a data is programmed to a certain memory cell, a high voltage is applied to the certain memory cell. At this time, the high voltage affects the periphery of the certain memory cell and hence the trapped electrons and electrons in the floating gates of other memory cells may possibly move. As described above, when the memory cell 110 is used for over a long period of time, electrons move into and out of its floating gate and thus the characteristic of the memory cell 110 is changed. It should be noted that with regard to the dummy cell 120, change over time of the characteristic as in the memory cell 110 is less likely to happen, since the control gate and the floating gate of the dummy cell 120 are shorted with each other.

The change over time of the characteristic of the memory cell 110 causes the following problem. FIG. 4 is a figure for explaining the problem and shows the temperature characteristic of the conventional nonvolatile semiconductor memory device 100. In FIG. 4, the vertical axis indicates the currents Icell and Isen, and the horizontal axis shows the temperature. Since the dummy cell 120 operates in the strong inversion region, the characteristic of the sense current Isen is indicated by the function fd (see also FIG. 3B).

Immediately after an erasing operation, an ON memory cell operates in the strong inversion region and the read current Ion is indicated by the function f0 (see also FIG. 3A). However, when electrons move into the floating gate due to the above-mentioned reason, the read current Ion gradually decreases and the ON memory cell operates in a region closer to the weak inversion region. As a result, the characteristic of the read current Ion gradually changes from the function f0 to a function f0'. It should be noted here that a slope of the function f0' is smaller than that of the function f0, since the operating region comes closer to the weak inversion region. In this case, the read operation can be normally carried out in normal to high temperature regions, since the read current Ion is larger than the sense current Isen. In a low temperature region, however, the read current Ion may possibly become smaller than the sense current Isen, as shown in FIG. 4. In that case, the read operation is not correctly carried out. Thus, it is not possible to operate the nonvolatile semiconductor memory device in the low temperature region.

Similarly, immediately after a programming operation, an OFF memory cell operates in the weak inversion region and the read current Ioff is indicated by the function f1 (see also FIG. 3A). However, when electrons move out of the floating gate due to the above-mentioned reason, the read current Ioff gradually increases and the OFF memory cell operates in a region closer to the strong inversion region. As a result, the characteristic of the read current Ioff gradually changes from the function f1 to a function f1'. It should be noted here that a slope of the function f1' is smaller than that of the function f1, since the operating region comes closer to the strong inversion region. In this case, the read operation can be normally carried out in low to normal temperature regions, since the read current Ioff is smaller than the sense current Isen. In a high temperature region, however, the read current Ioff may possibly become larger than the sense current Isen, as shown in FIG. 4. In that case, the read operation is not correctly carried out. Thus, it is not possible to operate the nonvolatile semiconductor memory device in the high temperature region.

As described above, according to the conventional nonvolatile semiconductor memory device 100, the operating states of the memory cell 110 and the dummy cell 120 are various, and thus temperature range within which the read operation can be normally carried out is narrowed. In other words, it is not possible to attain an excellent temperature characteristic. In recent years, read operations in a wider temperature range are required for a flash memory mounted on a microcomputer. For example, a conventional temperature range was approximately −10 to 125 degrees centigrade, while a temperature range of approximately −40 to 150 degrees centigrade is required in recent years.

In an aspect of the present invention, a nonvolatile semiconductor memory device has a readout circuit and a memory cell transistor including a control gate and a floating gate. The readout circuit senses a data stored in the memory cell transistor on the basis of a read current flowing through the memory cell transistor and a reference current flowing through a dummy cell transistor. In a read operation, a voltage between a gate and a source of the dummy cell transistor is set to be lower than a voltage between the control gate and a source of the memory cell transistor. More specifically, the voltage between the gate and the source of the dummy cell transistor is set such that the dummy cell transistor operates in a transition region between the strong inversion region and the weak inversion region.

In the present invention, as described above, the dummy cell transistor operates in the "transition region" between the strong inversion region and the weak inversion region. In the transition region, it is possible to obtain an intermediate characteristic between a characteristic of the strong inversion region in which a drain current decreases with increasing temperature and a characteristic of the weak inversion region in which a drain current increases with increasing temperature. Therefore, the reference current or a sense current takes a substantially constant value independently of temperature.

Immediately after an erasing operation, an ON memory cell operates in a strong inversion region. After that, a read current is decreased due to the change over time and hence an operating region comes closer to the transition region. As a result, the ON memory cell and the dummy cell operate near the transition region or in the transition region. In other words, both the read current and the sense current take substantially constant values independently of the temperature, respectively. Thus, the relationship between the read current and the sense current is prevented from being reversed. It is therefore possible to carry out the read operation in a wider temperature range. In other words, an operating margin of the nonvolatile semiconductor memory device with respect to the temperature is expanded.

On the other hand, immediately after a programming operation, an OFF memory cell operates in a weak inversion region. After that, a read current is increased due to the change over time and hence an operating region comes closer to the transition region. As a result, the OFF memory cell and the dummy cell operate near the transition region or in the transition region. In other words, both the read current and the sense current take substantially constant values independently of the temperature, respectively. Thus, the relationship between the read current and the sense current is prevented from being reversed. It is therefore possible to carry out the read operation in a wider temperature range. In other words, an operating margin of the nonvolatile semiconductor memory device with respect to the temperature is expanded.

According to the readout circuit of the present invention, a temperature characteristic of the nonvolatile semiconductor memory device is improved.

According to the readout circuit of the present invention, an operating range of the nonvolatile semiconductor memory device is expanded.

BRIEF DESCRIPTION OF THE DRAWINGS

The above and other objects, advantages and features of the present invention will be more apparent from the following description taken in conjunction with the accompanying drawings, in which:

FIG. 4 is a graph showing a temperature characteristic of the conventional nonvolatile semiconductor memory device;

FIG. 8 is a graph showing a temperature dependence of a drain current of the dummy cell according to the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the present embodiments illustrated for explanatory purposed.

First Embodiment (Configuration)

Figure 5:
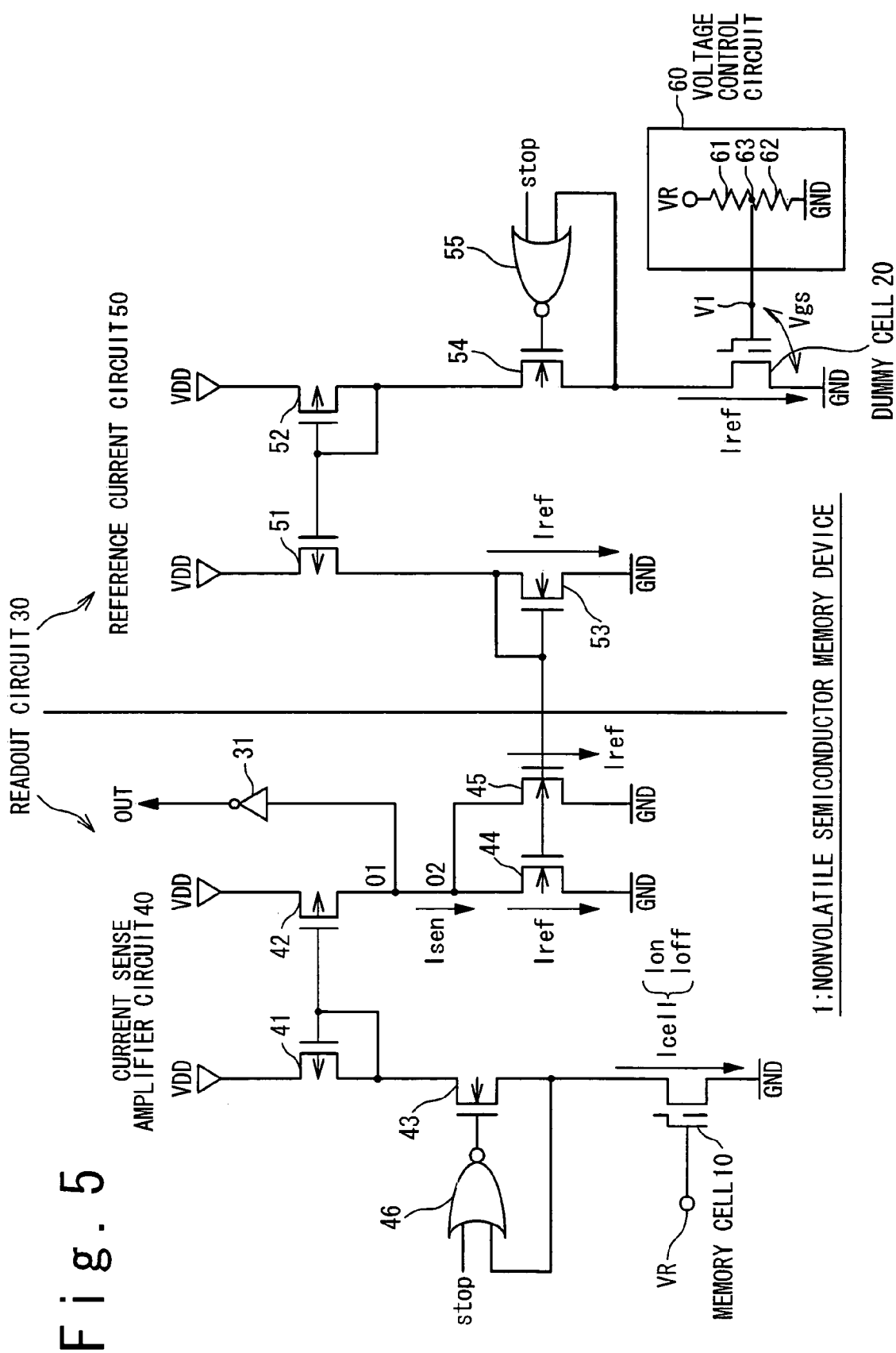
FIG. 5 is a circuit diagram showing a configuration of a nonvolatile semiconductor memory device according to a first embodiment of the present invention.

FIG. 5 is a circuit diagram showing a configuration of a nonvolatile semiconductor memory device 1 according to a first embodiment of the present invention. The nonvolatile semiconductor memory device 1 has a memory cell 10 and a readout circuit 30 for detecting a data stored in the memory cell 10. The readout circuit 30 includes a dummy cell 20, a current sense amplifier circuit 40, a reference current circuit 50 and a voltage control circuit 60.

Figure 6A:
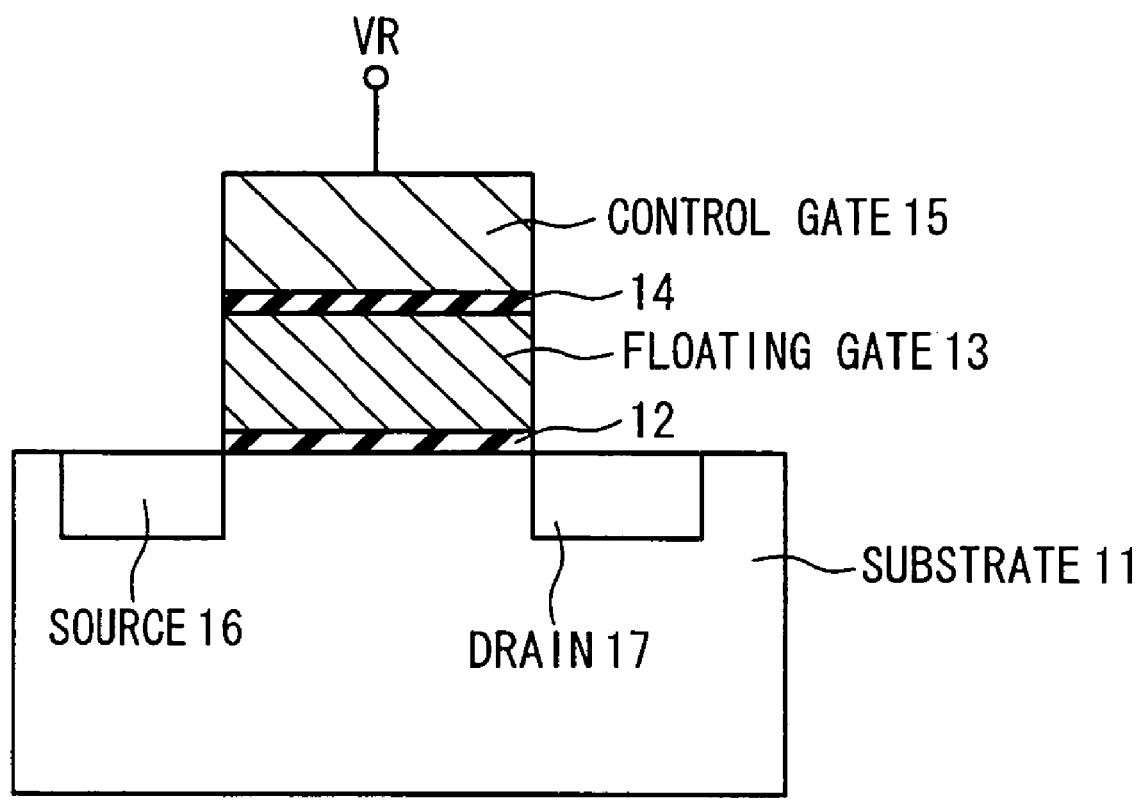
FIG. 6A is a cross-sectional view showing a structure of a memory cell according to the present invention.
Figure 6B:
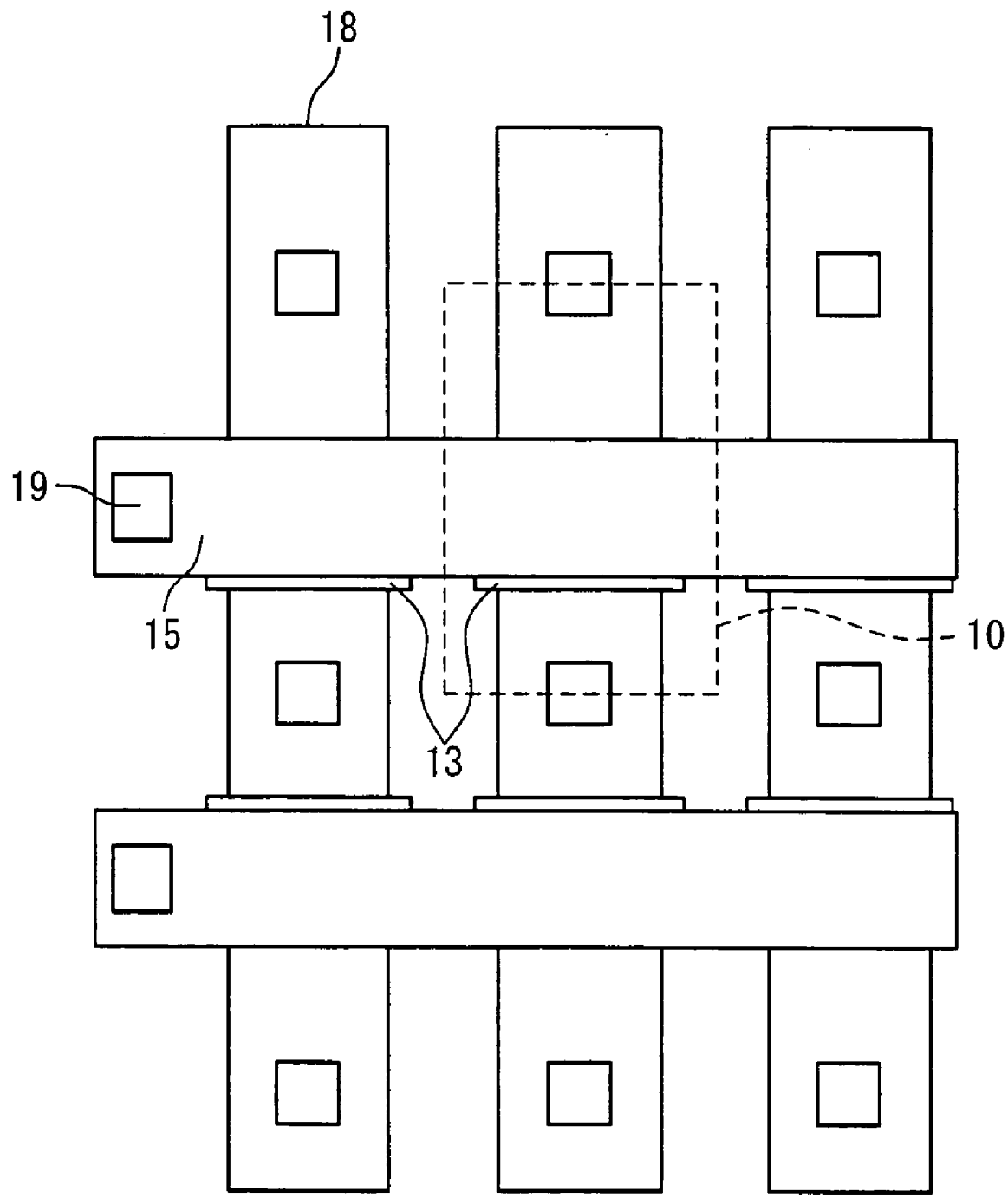
FIG. 6B is a plan view showing a structure of the memory cell according to the present invention.

The memory cell 10 is a stacked gate type N-channel transistor, and has a control gate and a floating gate. FIGS. 6A and 6B are a cross-sectional view and a plan view showing a structure of the memory cell 10 (memory cell transistor), respectively. As shown in FIG. 6A, a floating gate 13 is formed on a substrate 11 through a tunnel insulating film 12, and a control gate 15 is formed on the floating gate 13 through a gate insulating film 14. Also, a source 16 and a drain 17 are formed in the substrate 11. As shown in FIG. 6B, a diffusion layer 18 (the source 16 and the drain 17) is formed by using the control gate 15 as a mask. A contact 19 is formed to be connected to the control gate 15. The floating gate 13 is separately provided to each memory cell 10.

In a read operation, a "read voltage VR" is applied as a control gate voltage Vcg to the control gate 15 of the memory cell 10. As shown in FIG. 5, the source 16 of the memory cell 10 is connected to a ground GND. Therefore, in the present embodiment, the read voltage VR can be considered to represent a gate-source voltage Vgs of the memory cell 10. Also, the memory cell 10 in which electrons are injected into the floating gate 13 is referred to as an "OFF memory cell" hereinafter. On the other hand, the memory cell 10 in which electrons are drawn out of the floating gate 13 is referred to as an "ON memory cell" hereinafter. The ON memory cell is an erase memory cell from which the electrons are erased, and is related to a data value "0" for example. On the other hand, the OFF memory cell corresponds to a program memory cell, and is related to a data value "1" for example. Threshold voltages of the ON memory cell and the OFF memory cell are Vt0 and Vt1, respectively.

Figure 7A:
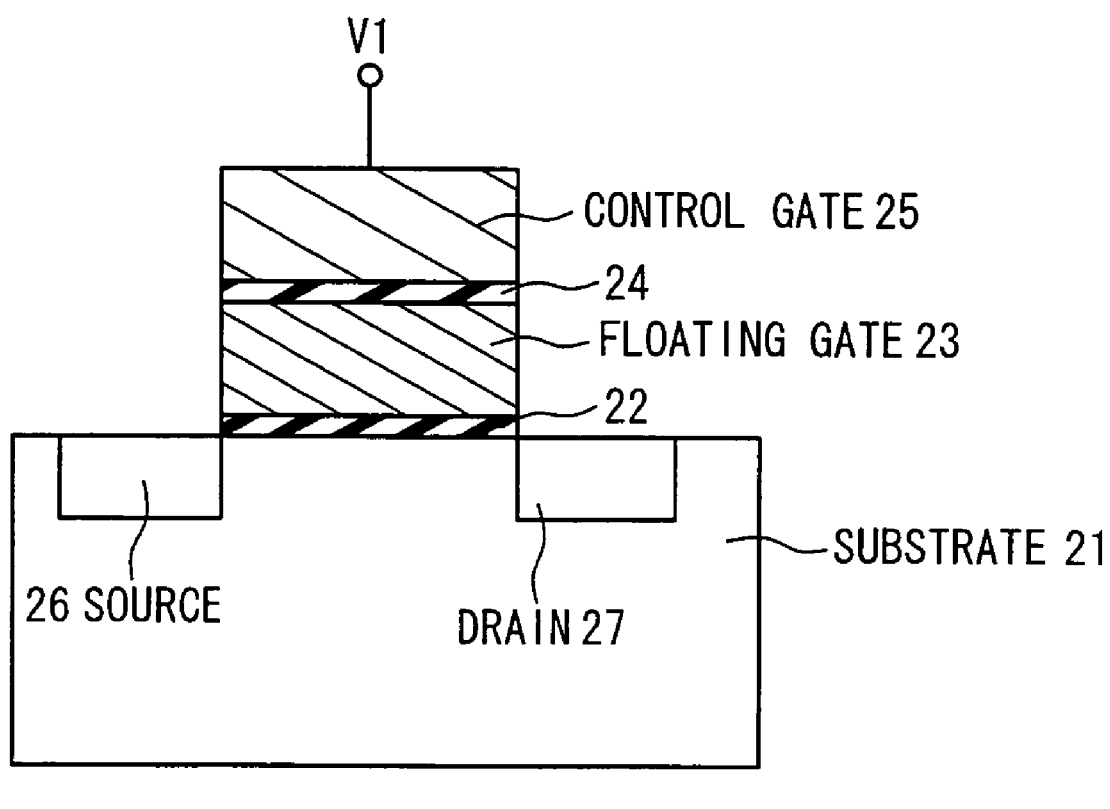
FIG. 7A is a cross-sectional view showing a structure of a dummy cell according to the present invention.
Figure 7B:
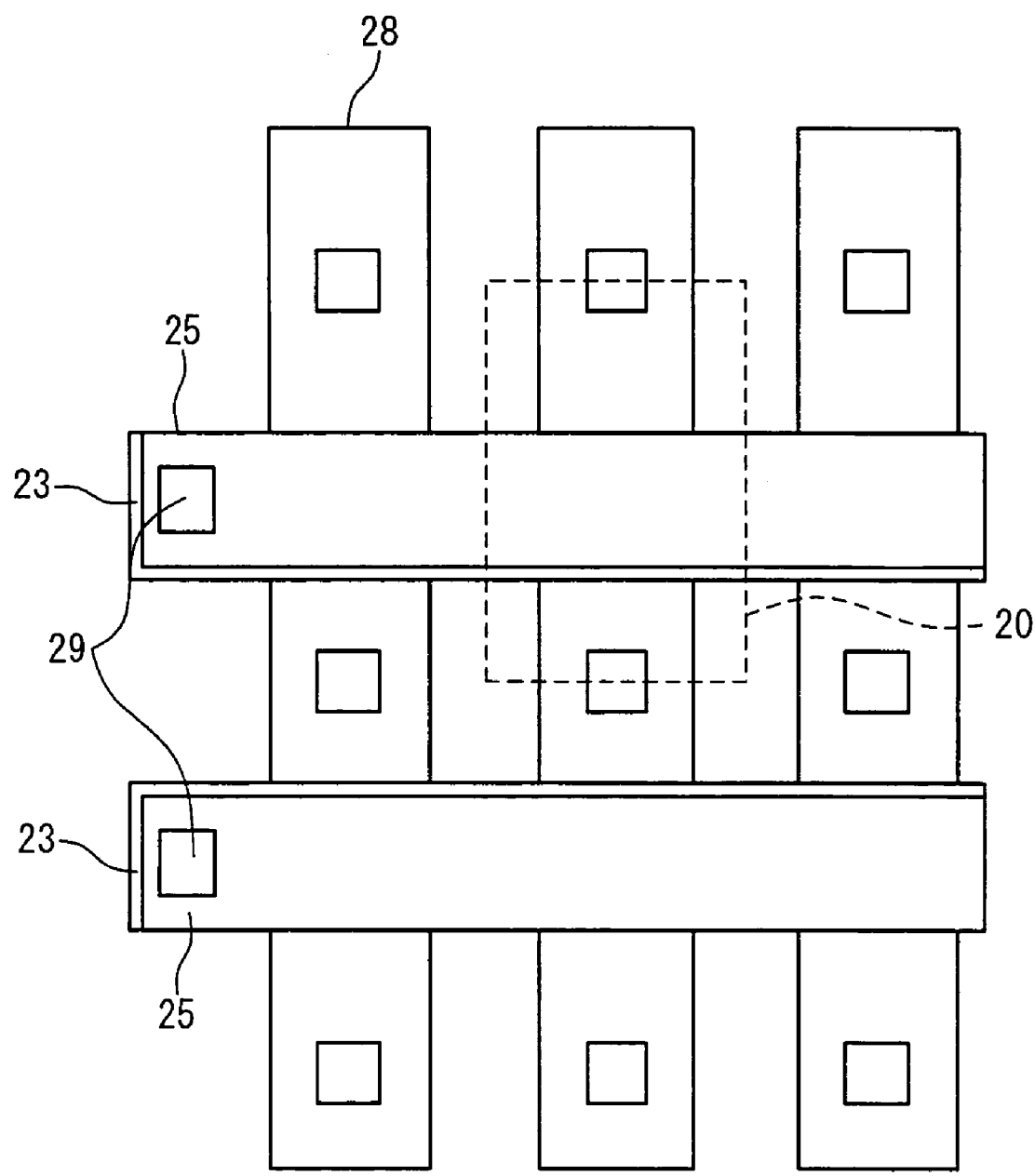
FIG. 7B is a plan view showing a structure of the dummy cell according to the present invention.

The dummy cell 20 has almost the same structure as the memory cell 10. That is, the dummy cell 20 is also a stacked gate type N-channel transistor, and has a control gate and a floating gate. FIGS. 7A and 7B are a cross sectional view and a plan view showing a structure of the dummy cell 20 (dummy cell transistor), respectively. As shown in FIG. 7A, a floating gate 23 is formed on a substrate 21 through a tunnel insulating film 22, and a control gate 25 is formed on the floating gate 23 through a gate insulating film 24. Also, a source 26 and a drain 27 are formed in the substrate 21. As shown in FIG. 7B, a diffusion layer (the source 26 and the drain 27) is formed by using the control gate 25 as a mask. With respect to the dummy cell 20, one floating gate 23 is shared by a plurality of cells and is formed to cross the plurality of cells. Also, the floating gate 23 is electrically connected to the control gate 25 through a contact 29 at the end of a cell array. That is to say, according to the present embodiment, the floating gate 23 and the control gate 25 of the dummy cell 20 are shorted with each other. As a result, the above-mentioned change over time of the characteristic is prevented with regard to the dummy cell 20 used for generating a reference current.

In a read operation, a "first voltage V1" is applied as the control gate voltage Vcg to the control gate 25 of the dummy cell 20. As shown in FIG. 5, the source 26 of the dummy cell 20 is connected to the ground GND. Therefore, in the present embodiment, the first voltage V1 can be considered to represent a gate-source voltage Vgs of the dummy cell 20. A threshold voltage of the dummy cell 20 is Vtd.

The current sense amplifier circuit 40 is a circuit for detecting whether a memory cell current Icell (read currents Ion and Ioff) flowing through the memory cell 10 is large or small and thereby sensing the data value stored in the memory cell 10. As shown in FIG. 5, the current sense amplifier circuit 40 is provided with a PMOS 41, a PMOS 42, an NMOS 43, an NMOS 44, an NMOS 45 and an NOR 46. The PMOSs 41 and 42 constitute a current mirror circuit. The drain of the memory cell 10 is connected to the current mirror circuit through the NMOS 43. The NOR 46 turns off the NMOS 43 in response to a stop signal Stop and thereby prevents electric currents from flowing when unnecessary. An output of the current mirror circuit is connected to a connection point O1, and the connection point O1 is connected to an output OUT through an inverter 31. Sources of the NMOSs 44 and 45 are connected to the ground GND, and the drains thereof are connected to a connection point O2. The connection points O1 and O2 are connected to each other.

The reference current circuit 50 is a circuit for generating a reference current Iref which the current sense amplifier circuit 40 uses to detect whether the memory cell current Icell is large or small. As shown in FIG. 5, the reference current circuit 50 is provided with a PMOS 51, a PMOS 52, an NMOS 53, an NMOS 54 and an NOR 55. The PMOSs 51 and 52 constitute a current mirror circuit. The drain of the dummy cell 20 is connected to the current mirror circuit through the NMOS 54. The NOR 55 turns off the NMOS 54 in response to the stop signal Stop and thereby prevents electric currents from flowing when unnecessary. An output of the current mirror circuit is connected to the NMOS 53. The NMOSs 53 and 44 also constitute a current mirror circuit, and the NMOSs 53 and 45 also constitute a current mirror circuit. It should be noted that the number of transistors similar to the NMOSs 44 and 45 constituting the current mirror circuit together with the NMOS 53 is arbitrarily set.

The PMOSs 41, 42, 51 and 52 all have the same size. The NMOSs 43 and 54 have the same size. The NMOSs 44, 45 and 53 have the same size. Also, transistors forming the NORs 46 and 55 have the same size.

The voltage control circuit 60 is a circuit for supplying the "first voltage V1" to the control gate 25 of the dummy cell 20. For example, in FIG. 5, the voltage control circuit 60 includes a first resistance 61 and a second resistance 62 which are connected in series. One end of the first resistance 61 is connected to an intermediate node 63, and the other end is connected to a terminal to which the voltage (read voltage VR) applied to the control gate 15 of the memory cell 10 is supplied. Also, one end of the second resistance 62 is connected to the intermediate node 63, and the other end is connected to the ground GND. The intermediate node 63 is connected to the control gate 25 of the dummy cell 20.

(Operation)

According to the present embodiment, the voltage control circuit 60 supplies the first voltage V1 to the control gate 25 of the dummy cell 20 in a read operation. Here, the first voltage V1 is set such that the gate-source voltage Vgs of the dummy cell 20 is lower than the gate-source voltage Vgs of the memory cell 10. In the present embodiment, the gate-source voltage Vgs of the memory cell 10 is the read voltage VR, and the gate-source voltage Vgs of the dummy cell 20 is the first voltage V1. That is, the voltage control circuit 60 sets the first voltage V1 to be lower than the read voltage VR.

In the case of the example shown in FIG. 5, the voltage control circuit 60 supplies the voltage of the intermediate node 63 as the first voltage V1 to the control gate 25. Thus, when resistances of respective of the first resistance 61 and the second resistance 62 are R1 and R2, the first voltage V1 is given by the following equation:

$$V1 = \alpha VR = \frac{R2}{R1 + R2} VR \quad (4)$$

Here, a parameter α is a ratio of the first voltage V1 to the read voltage VR, and takes a value in a range from 0 to 1. By adjusting the resistances R1 and R2, it is possible to control the parameter α, namely the first voltage V1.

More specifically, in the present embodiment, the voltage control circuit 60 sets the first voltage V1 to the threshold voltage Vtd of the dummy cell 20 or near the threshold voltage Vtd. In this case, the dummy cell 20 operates in a "transition region" between the strong inversion region and the weak inversion region. The "transition region" is an intermediate region of changing from the strong inversion region to the weak inversion region or from the weak inversion region to the strong inversion region. That is to say, in the transition region, it is possible to obtain an intermediate characteristic between a characteristic of the strong inversion region in which the drain current decreases with increasing temperature and a characteristic of the weak inversion region in which the drain current increases with increasing temperature.

Figure 3A:
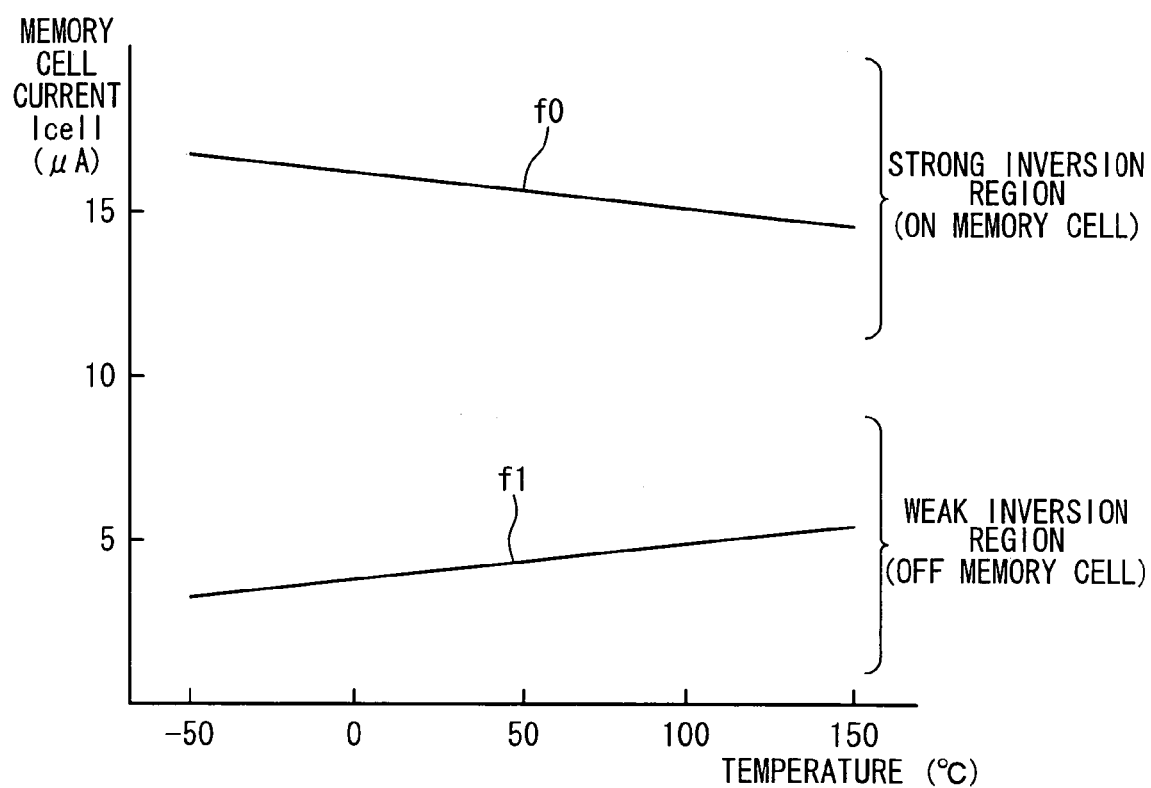
FIG. 3A is a graph showing a temperature dependence of a drain current of the memory cell according to the conventional technique.
Figure 3B:
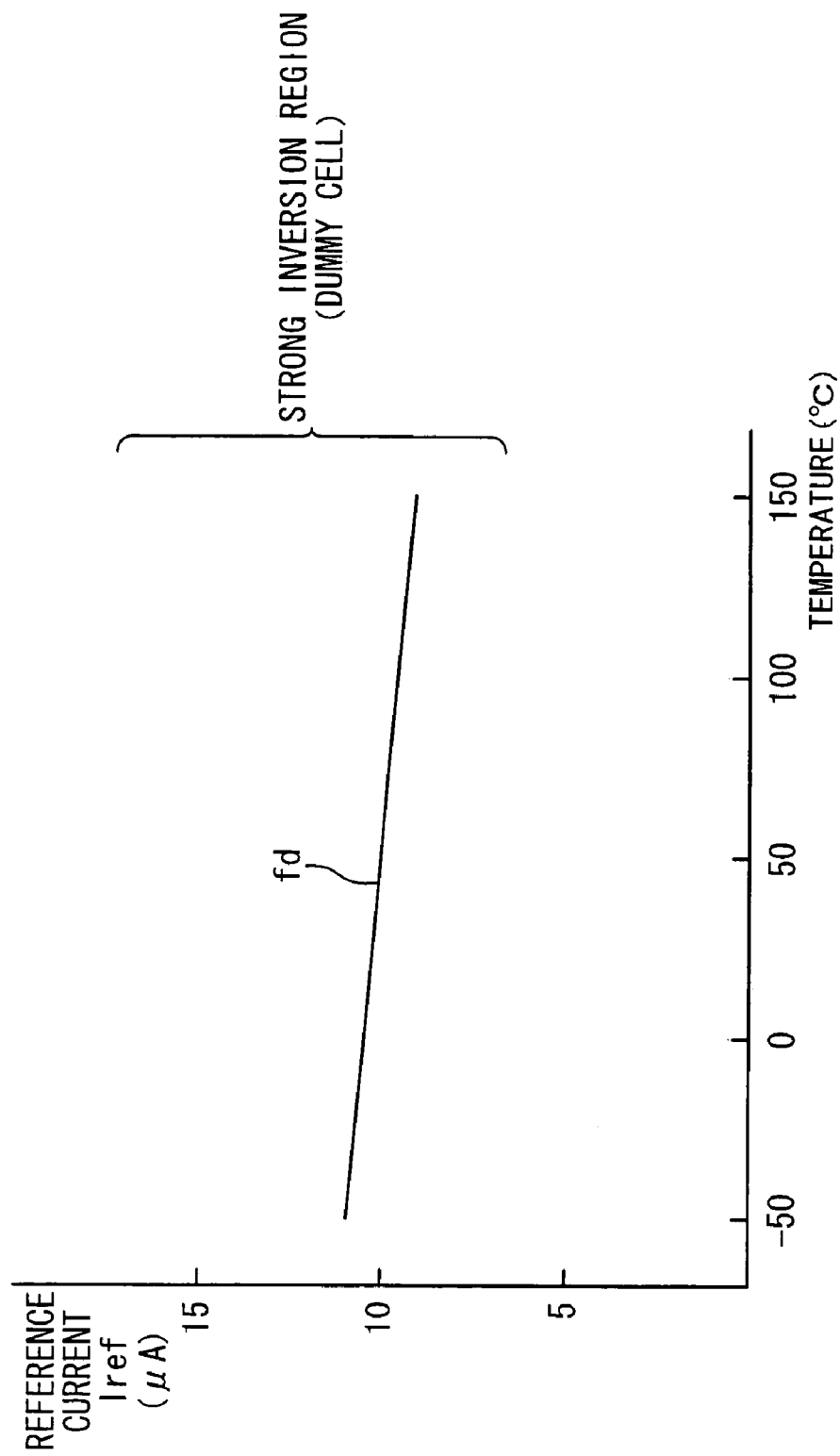
FIG. 3B is a graph showing a temperature dependence of a drain current of the dummy cell according to the conventional technique.

FIG. 8 shows temperature dependence of the reference current Iref flowing through the dummy cell 20 in the present embodiment. In FIG. 8, the vertical axis indicates the reference current (dummy cell current) Iref, and the horizontal axis indicates the temperature. For example, voltage of 3.0 V is applied as the read voltage VR. According to the conventional technique, the reference current Iref has a characteristic indicated by a function fd, since the dummy cell operates in the strong inversion region (see also FIG. 3). According to the present embodiment, however, the first voltage V1 smaller than the read voltage VR is applied to the control gate 25 of the dummy cell 20. More specifically, the resistances R1 and R2 are set such that the first voltage V1 is substantially equal to the threshold voltage Vtd of the dummy cell 20. As a result, the dummy cell 20 operates in the "transition region" between the strong inversion region and the weak inversion region. In this case, the reference current Iref has a characteristic indicated by a "function fD" in FIG. 8. The characteristic is an intermediate characteristic between a characteristic of the strong inversion region in which the drain current decreases with increasing temperature and a characteristic of the weak inversion region in which the drain current increases with increasing temperature. Thus, according to the present embodiment, the reference current Iref from the dummy cell 20 is independent of the temperature, and takes an almost constant value irrespective of the temperature. In FIG. 8, for example, the reference current Iref is approximately 5 μA.

With reference to FIG. 5, the reference current Iref generated by the dummy cell 20 flows through the PMOS 52. Since the PMOSs 51 and 52 constitute the current mirror circuit and the transistor sizes thereof are the same, the current flowing through the PMOS 51 is equal to the reference current Iref. Therefore, the reference current Iref also flows through the NMOS 53. Since the NMOSs 44 and 53 constitute the current mirror circuit and the transistor sizes thereof are the same, the current flowing through the NMOS 44 is equal to the reference current Iref. Similarly, since the NMOSs 45 and 53 constitute the current mirror circuit and the transistor sizes thereof are the same, the current flowing through the NMOS 45 is also equal to the reference current Iref. As a result, current at the connection point O2 is twice the reference current Iref (e.g. 10 μA). The current at the connection point O2, which is used for sensing data stored in the memory cell 10, is referred to as a "sense current Isen" hereinafter.

Also, when the read voltage VR is applied to the control gate 15 of the memory cell 10, the memory cell current Icell (Ion, Ioff) in accordance with the stored data value flows through the memory cell 10. The memory cell current Icell also flows through the PMOS 41. Since the PMOSs 41 and 42 configure the current mirror circuit and the transistor sizes thereof are the same, the current flowing through the PMOS 42 is equal to the memory cell current Icell.

When the memory cell 10 is an ON memory cell (data value: 0), namely, when the memory cell current Icell is the read current Ion, the read current Ion is larger than the sense current Isen. Therefore, the voltage at the connection point O1 is increased up to near the power supply voltage VDD, and thus a logical value "Low" is output from the output OUT. On the other hand, when the memory cell 10 is an OFF memory cell (data value: 1), namely, when the memory cell current Icell is the read current Ioff, the read current Ioff is smaller than the sense current Isen. Therefore, the voltage at the connection point O1 is decreased down to near the ground voltage GND, and thus a logical value "Hi" is output from the output OUT.

(Effect)

Figure 9:
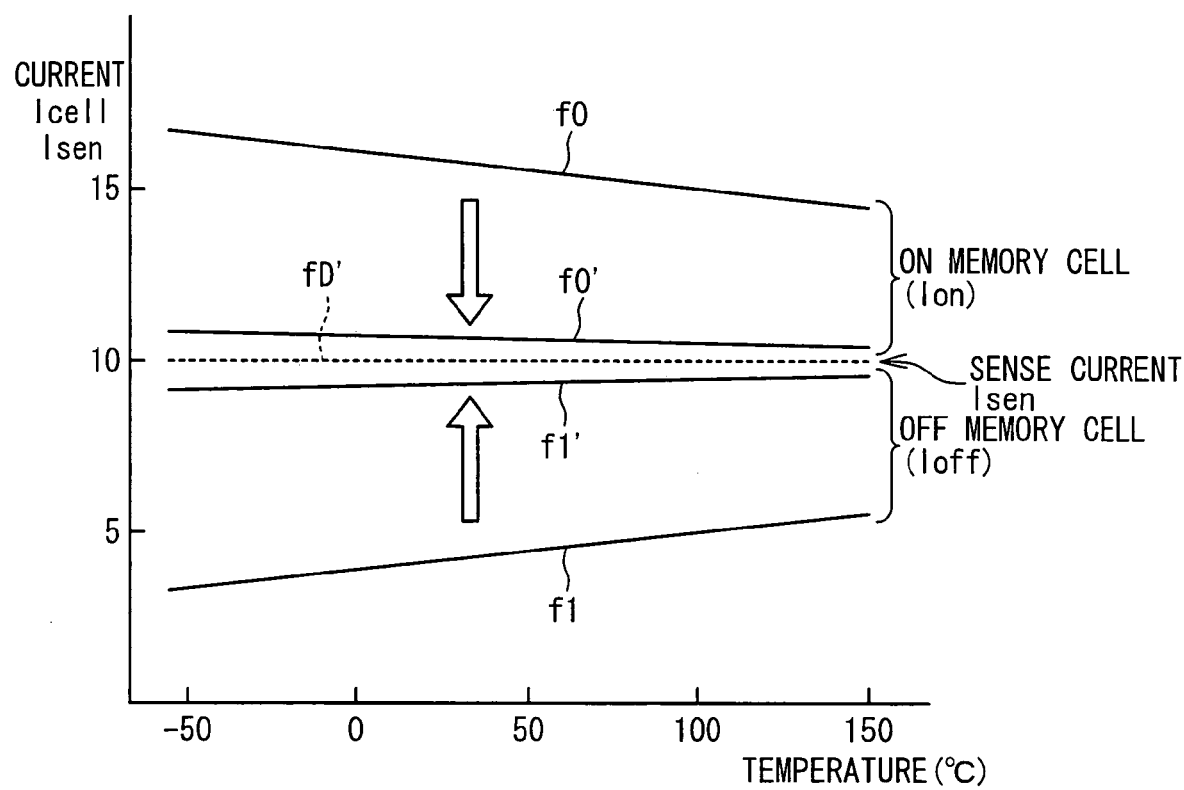
FIG. 9 is a graph showing a temperature characteristic of the nonvolatile semiconductor memory device according to the present invention.

Effects of the present embodiment are as follows. FIG. 9 shows temperature characteristic of the nonvolatile semiconductor memory device 1 according to the present embodiment. In FIG. 9, the vertical axis indicates the currents Icell and Isen, and the horizontal axis indicates the temperature. As stated above, the voltage control circuit 60 sets the first voltage V1 such that the dummy cell 20 operates in the "transition region" between the strong inversion region and the weak inversion region. Therefore, the reference current Iref takes an almost constant value independently of the temperature (see FIG. 8). In addition, the sense current Isen generated from the reference current Iref also takes an almost constant value independently of the temperature. In FIG. 9, the characteristic of the sense current Isen is indicated by a function fD'.

Immediately after an erasing operation, the ON memory cell operates in the strong inversion region, and the read current Ion is indicated by a function f0. After that, the read current Ion is reduced due to the change over time (secular variation), and the characteristic of the read current Ion gradually changes from the function f0 to a function f0'. Since the operating region comes closer to the transition region, a slope of the function f0' is smaller than that of the function f0. In other words, the dummy cell 20 and the ON memory cell operate in the transition region or near the transition region. For this reason, not only the sense current Isen but also the read current Ion takes an almost constant value independently of the temperature. Thus, the relationship between the read current Ion and the sense current Isen is prevented from being reversed. Since the read current Ion is larger than the sense current Isen over the range from the low temperature region to the high temperature region, the read operation is normally carried out in a wider temperature range. In other words, an operating margin with respect to the temperature is expanded, and the temperature characteristic of the nonvolatile semiconductor memory device 1 is improved.

Also, immediately after an programming operation, the OFF memory cell operates in the weak inversion region, and the read current Ioff is indicated by a function f1. After that, the read current Ioff is increased due to the change over time (secular variation), and the characteristic of the read current Ioff gradually changes from the function f1 to a function f1'. Since the operating region comes closer to the transition region, a slope of the function f1' is smaller than that of the function f1. In other words, the dummy cell 20 and the OFF memory cell operate in the transition region or near the transition region. For this reason, not only the sense current Isen but also the read current Ioff takes an almost constant value independently of the temperature. Thus, the relationship between the read current Ioff and the sense current Isen is prevented from being reversed. Since the sense current Isen is larger than the read current Ioff over the range from the low temperature region to the high temperature region, the read operation is normally carried out in a wider temperature range. In other words, an operating margin with respect to the temperature is expanded, and the temperature characteristic of the nonvolatile semiconductor memory device 1 is improved.

According to the present embodiment, as described above, an operating status of a memory cell 10 comes closer to that of the dummy cell 20 after the memory cell 10 to which the programming/erasing is performed is used for a long time period. It is therefore possible to carry out the read operation in a wider temperature range. In other words, an operating margin of the nonvolatile semiconductor memory device 1 with respect to the temperature is expanded.

Second Embodiment (Configuration)

A nonvolatile semiconductor memory device according to a second embodiment of the present invention has the same configuration as shown in FIG. 5. It should be noted that whether the NMOS 45 for generating the sense current Isen from the reference current Iref is provided or not can be designed arbitrarily. The point is the sense current Isen is generated on the basis of the reference current Iref. In a description given below, the sense current Isen and the reference current Iref are treated equivalently.

(Operation)

As in the case of the first embodiment, the voltage control circuit 60 supplies the first voltage V1 to the control gate 25 of the dummy cell 20 in a read operation. The first voltage V1 is set to be smaller than the read voltage VR applied to the control gate 15 of the memory cell 10.

(Effect)

Figure 10:
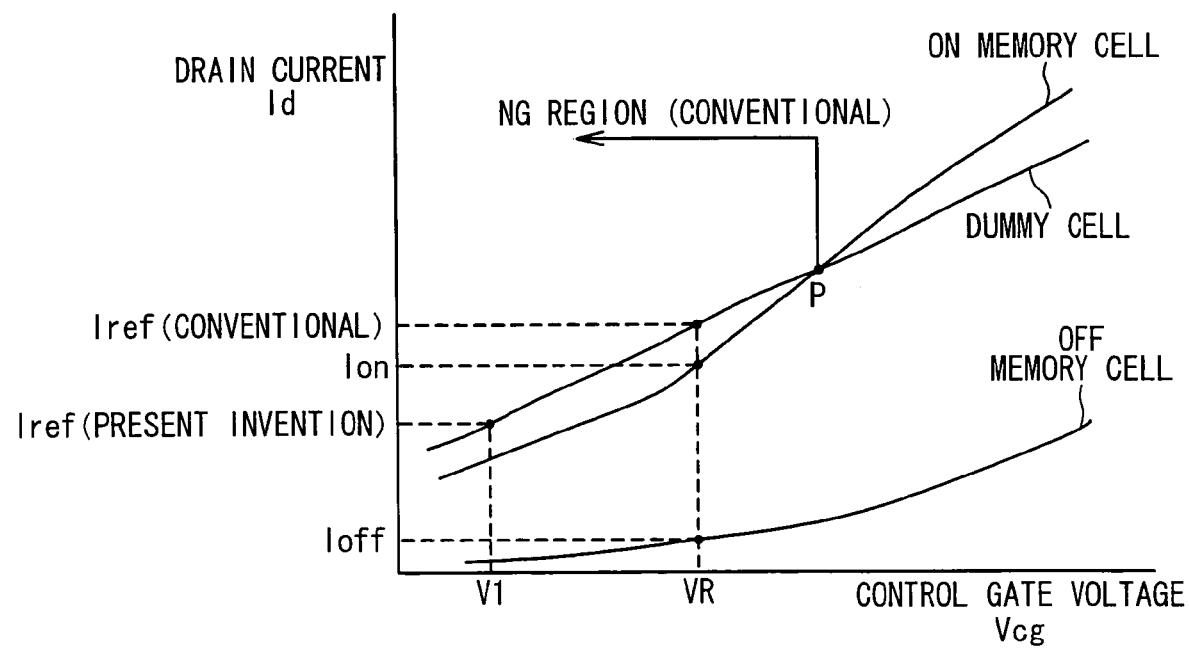
FIG. 10 is a graph showing IV characteristics of the memory cell and the dummy cell.

FIG. 10 shows IV characteristics of the memory cell 10 and the dummy cell 20. The vertical axis indicates the drain current Id, and the horizontal axis indicates the voltage Vcg (the read voltage VR, the first voltage V1) applied to respective control gates 15 and 25. A line indicating the IV characteristic of the ON memory cell and a line indicating the IV characteristic of the dummy cell 20 intersect at a point P in FIG. 10. Similarly, a line indicating the IV characteristic of the OFF memory cell and the line indicating the IV characteristic of the dummy cell 20 intersect at some point (not shown).

According to the conventional technique, the same read voltage VR is applied to the control gate 15 of the ON memory cell and the control gate 25 of the dummy cell 20. Here, a relation of "Ion>Iref>Ioff" has to be met in order to normally carry out the read operation for the memory cell 10. It is therefore impossible in the conventional technique to set the read voltage VR equal to or less than a value (limit value) corresponding to the point P. If the read voltage VR is equal to or less than the limit value, the read current Ion becomes smaller than the reference current Iref, as shown in FIG. 10. There exists a similar kind of a limit value with respect to the read current Ioff as well. These mean that the operating region of the nonvolatile semiconductor memory device 1 has a limitation.

According to the present invention, however, the first voltage V1 supplied to the dummy cell 20 is lower than the read voltage VR supplied to the ON memory cell. Therefore, the reference current Iref in the present invention is smaller than the conventional reference current Iref when the same read voltage VR is applied. It is thus possible to generate the reference current Iref smaller than the read current Ion, even if the read voltage VR is set smaller than the limit value, as shown in FIG. 10. In other words, even if the read voltage VR is in a conventionally NG region, it is possible to set the reference current Iref (the first voltage V1) to satisfy the relation of "Ion>Iref>Ioff", and to achieve the normal read operation. Thus, according to the present invention, an operating margin of the nonvolatile semiconductor memory device 1 with respect to the read voltage VR is expanded. In recent years, a lower-voltage power supply is increasingly demanded, and it is desired to set the read voltage VR lower. In this respect, the present embodiment is preferable in particular.

Third Embodiment (Configuration)

A nonvolatile semiconductor memory device according to a third embodiment of the present invention has the same configuration as the second embodiment.

(Operation)

The present embodiment is a special case of the second embodiment. As in the second embodiment, the first voltage V1 is set to be smaller than the read voltage VR applied to the control gate 15 of the memory cell 10 in a read operation. Consequently, the normal operation region where the reference current Iref is smaller than the read current Ion is expanded. Furthermore, according to the present embodiment, the above-mentioned parameter $\alpha$ (see the equation (4)) is set to a specific value described below.

A capacitance between the control gate 15 and the floating gate 13 of the memory cell 10 is given by C1. A capacitance between the floating gate 13 of the memory cell 10 and a substrate surface on which an inversion layer is formed is given by C2. In this case, a gate capacitance Cox of the memory cell 10 is given by the following equation: Cox=C1*C2/(C1+C2). The gate voltage applied to the control gate 15 at the time of a read operation is the read voltage VR. The threshold voltage of the ON memory cell is Vt0. When the foregoing equation (2) is transformed with using the above parameters, the read current Ion in the strong inversion region flowing through the ON memory cell is given by the following equation:

$$I_{on} = \frac{W}{L}\mu\frac{C1 \cdot C2}{C1+C2}(VR-Vt0)V_d \qquad (5)$$

On the other hand, the dummy cell 20 has almost the same structure as the memory cell 10, but the control gate 25 and the floating gate 23 of the dummy cell 20 are shorted with each other. Therefore, a gate capacitance Cox of the dummy cell 20 is given by the following equation: Cox=C2. The gate voltage applied to the control gate 25 at the time of the read operation is the first voltage V1. Also, the threshold voltage of the dummy cell 20 is Vtd. When the foregoing equation (2) is transformed with using the above parameters, the reference current Iref in the strong inversion region flowing through the dummy cell 20 is given by the following equation:

$$I_{ref} = \frac{W}{L}\mu C2(V1-Vtd)V_d \qquad (6)$$

The first voltage V1 is given by the foregoing equation (4). According to the present embodiment, the parameter $\alpha$ is set to satisfy the following equation:

$$\alpha = \frac{R2}{R1+R2} = \frac{C1}{C1+C2} \qquad (7)$$

In this case, coefficients with respect to the read voltage VR are identical in the equations (5) and (6), as can be clearly seen when the equations (5) and (6) are developed by the use of the equations (4) and (7); the identical coefficient is $(W/L)*\mu*C1*C2/(C1+C2)$. This means that variation rates of the currents Ion and Iref to "the change in the read voltage VR" are equal. It should be noted that respective of the gate length L and the gate width W are the same between the memory cell 10 and the dummy cell 20 in the present embodiment.

Figure 11:
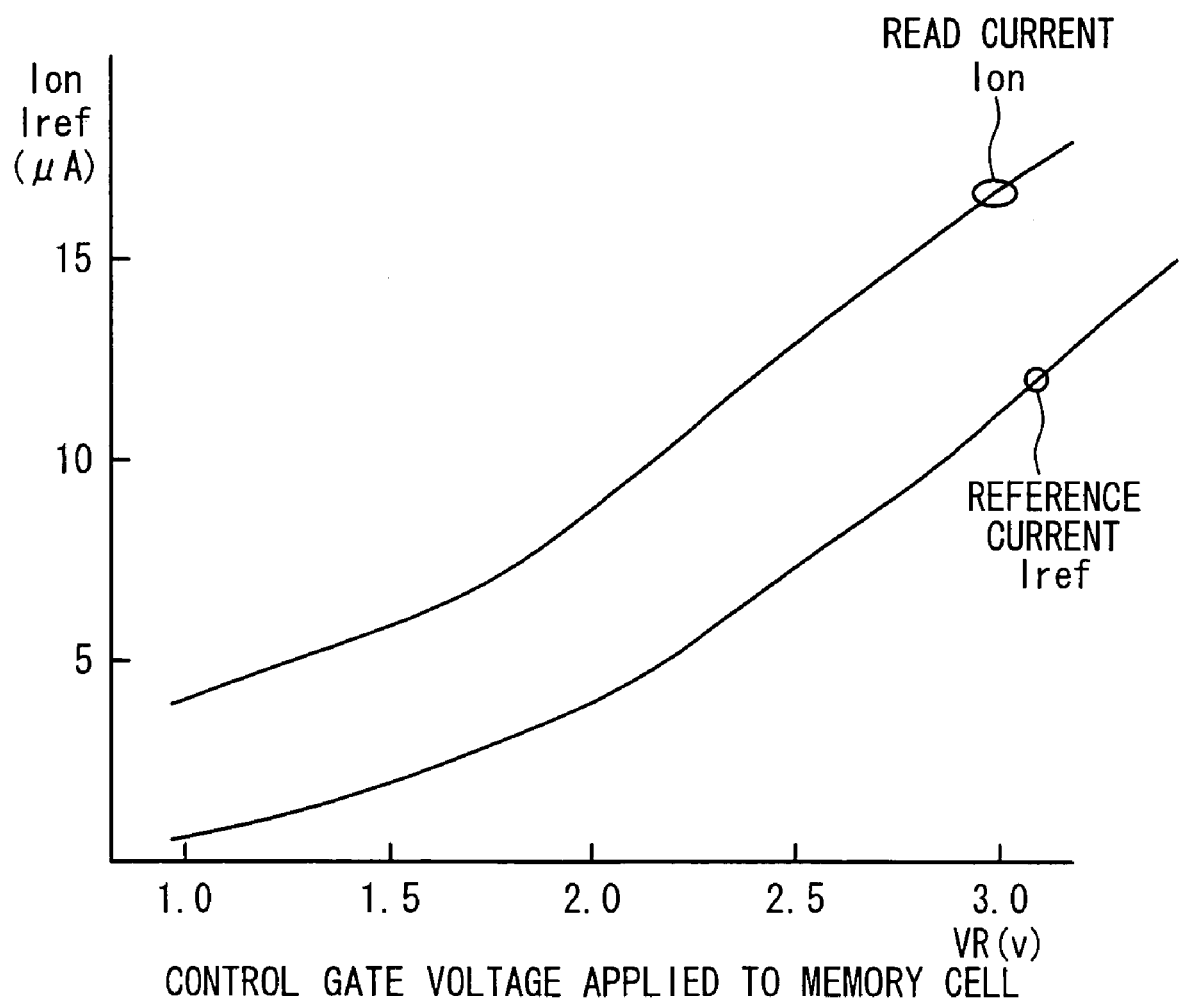
FIG. 11 is a graph showing read voltage dependences of a read current and a reference current according to the present invention.

FIG. 11 shows dependences of the read current Ion and the reference current Iref on the "read voltage VR". It should be noted that the horizontal axis indicates the read voltage VR or the first voltage V1 in the foregoing FIG. 10, while the horizontal axis indicates only the read voltage VR in the present FIG. 11. In FIG. 11, a value of the reference current Iref corresponding to a certain read voltage VR is a current value flowing through the dummy cell 20 when the first voltage V1 corresponding to the certain read voltage VR is applied to the control gate 25.

The read current Ion changes in accordance with the change in the read voltage VR. Also, the first voltage V1 changes in conjunction with the change in the read voltage VR such that the relationships given by the equations (4) and (7) are satisfied. In accordance with the change in the first voltage V1, the reference current Iref also changes. According to the present embodiment, as mentioned above and shown in FIG. 11, the variation rates of the currents Ion and Iref to the change in the read voltage VR are identical in the strong inversion region. That is, change characteristics with regard to the read voltage VR are the same.

Figure 1:
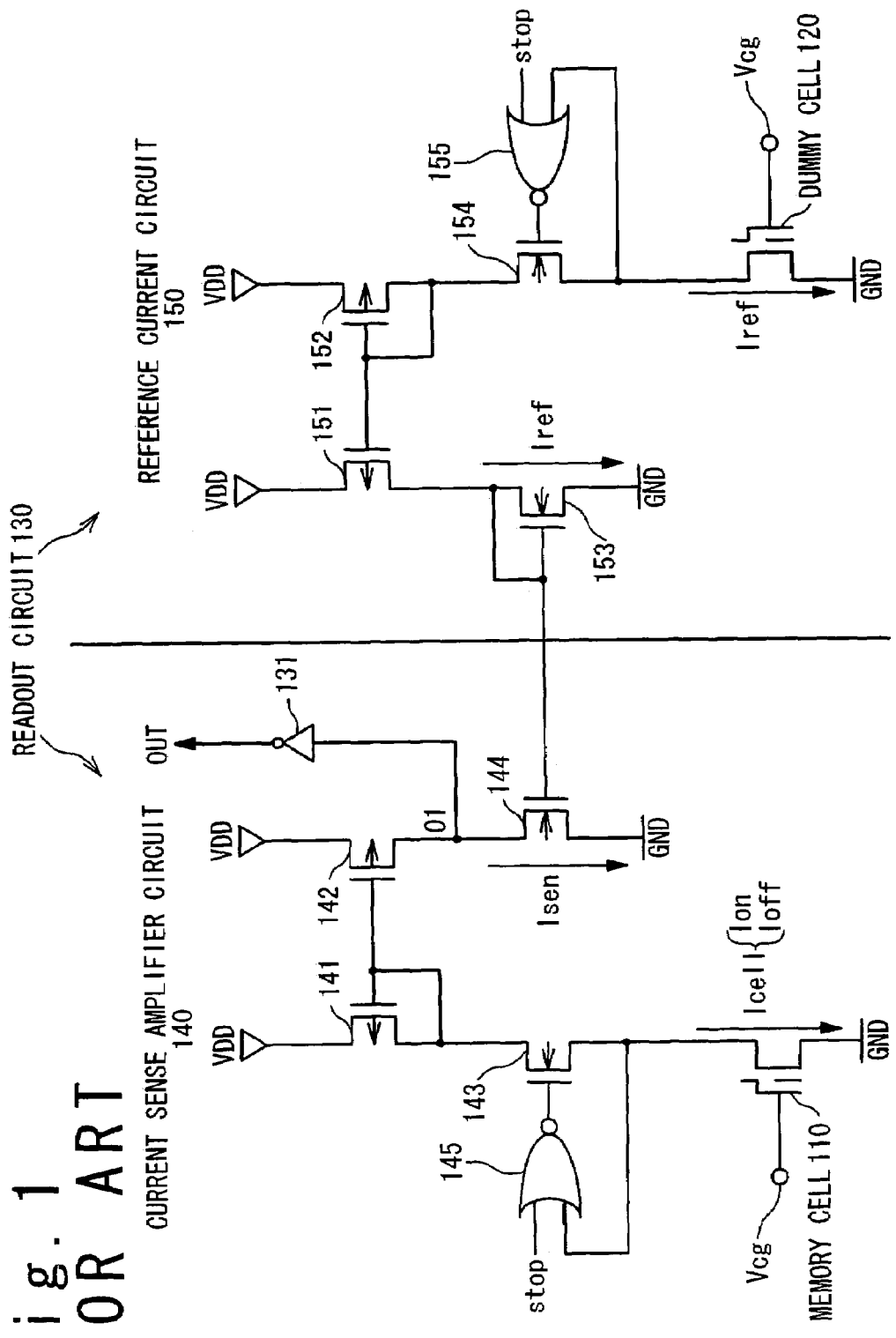
FIG. 1 is a circuit diagram showing a configuration of a conventional nonvolatile semiconductor memory device.
Figure 2:
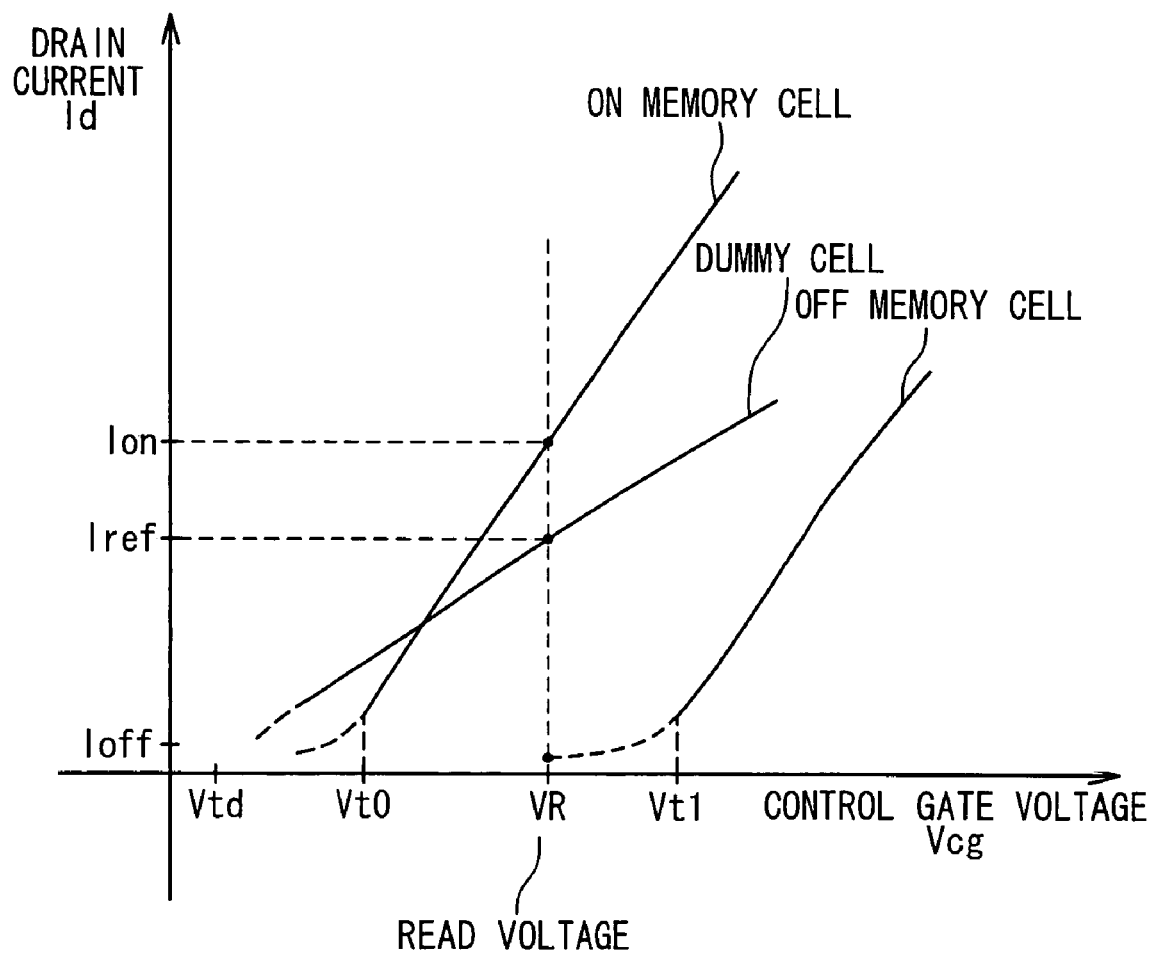
FIG. 2 is a graph showing IV characteristics of a memory cell and a dummy cell according to a conventional technique.

It should be noted that a case is shown in FIG. 1 where both the memory cell 10 and the dummy cell 20 transit from the strong inversion region to the weak inversion region at almost the same read voltage VR. The reason is as follows. The gate capacitance (C2) of the dummy cell 20 is larger than the gate capacitance $(C1*C2/(C1+C2))$ of the memory cell 10. Since the threshold voltage of a transistor correlates inversely with the gate capacitance, the threshold voltage Vtd of the dummy cell 20 is smaller than the threshold voltage Vt0 of the memory cell 10. Also, the first voltage V1 supplied to the control gate 25 of the dummy cell 20 is smaller than the read voltage VR supplied to the control gate 15 of the memory cell 10. Therefore, when the memory cell 10 operates in the vicinity of the threshold, the dummy cell 20 is considered to operate in the vicinity of the threshold as well.

Figure 12:
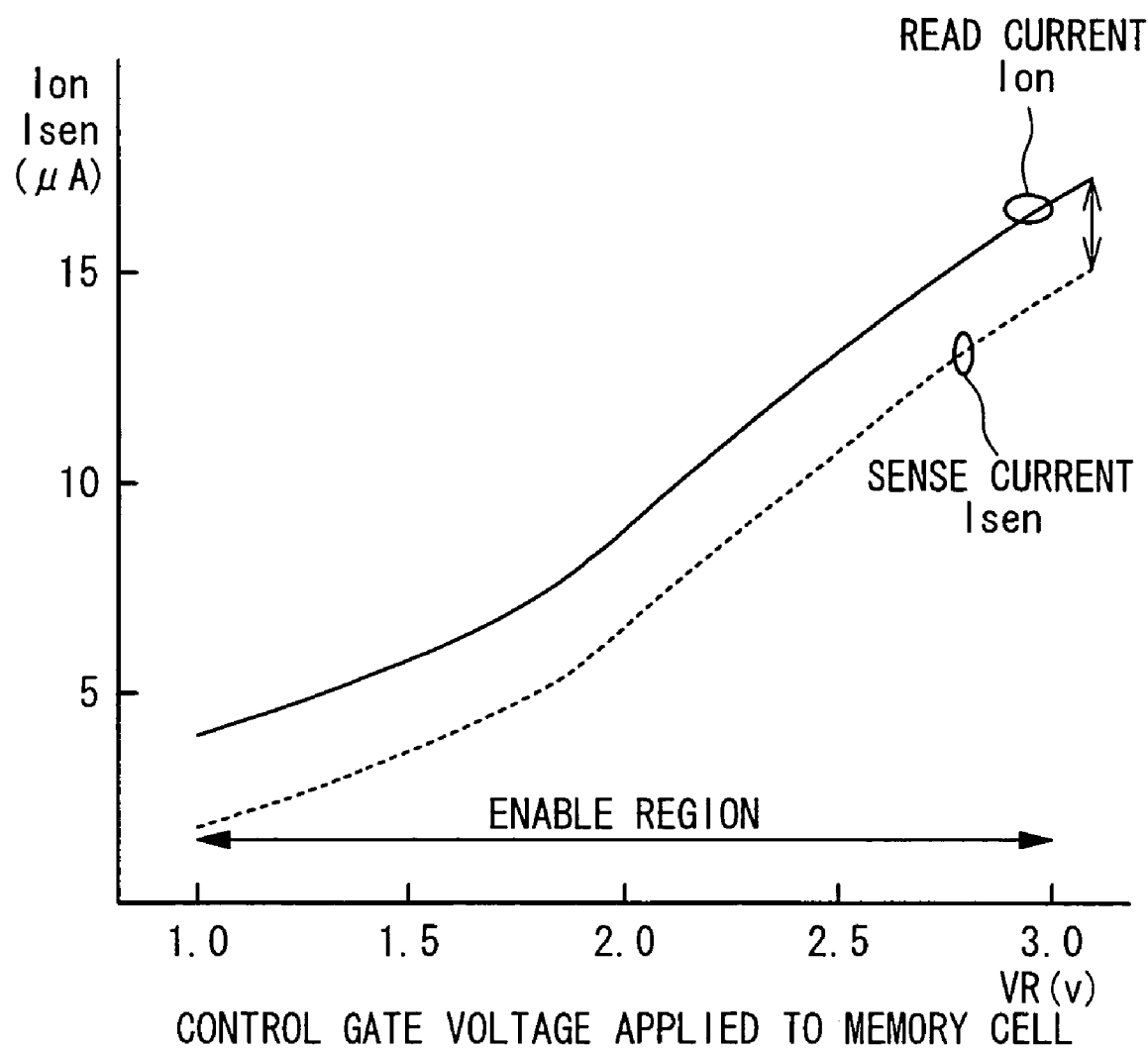
FIG. 12 is a graph showing read voltage dependences of a read current and a sense current according to the present invention.

Similarly to FIG. 11, FIG. 12 shows dependences of the read current Ion and the sense current Isen on the read voltage VR. As in FIG. 11, the horizontal axis indicates the read voltage VR. The vertical axis indicates the sense current Isen instead of the reference current Iref. The sense current Isen is generated based on the reference current Iref. Therefore, the change characteristic of the sense current Isen with respect to the read voltage VR is the same as that of the read current Ion.

As described above, the present embodiment is a special case of the second embodiment, and the parameter α is determined to satisfy the above equation (7). That is to say, the resistance values R1 and R2 are designed such that the equation (7) is satisfied. As a result, the variation rates (slopes) of the currents Ion and Iref to the read voltage VR are set to be the same. For example, a general flash memory is often manufactured such that the capacitances C1 and C2 have the same value. In this case, the parameter α is 0.5. Therefore, when the resistance values R1 and R2 are designed to have the same value, the equation (7) is satisfied. In this case, the voltage control circuit 60 supplies half the read voltage VR to the control gate 25 of the dummy cell 20.

(Effect)

According to the present embodiment, the first voltage V1 supplied to the dummy cell 20 is lower than the read voltage VR supplied to the ON memory cell. Consequently, the operating region where the reference current Iref is smaller than the read current Ion is expanded, as in the case of the second embodiment. Furthermore, since the parameter α is set to meet the equation (7), the two lines indicating the characteristics of both cells are prevented from intersecting with each other, as shown in FIGS. 11 and 12. It is therefore possible to maximize the range of the read voltage VR in which normal read operation is achieved. That is, the operating margin of the nonvolatile semiconductor memory device 1 with respect to the read voltage VR is expanded to the maximum extent possible.

The read voltage VR is typically a power supply voltage. According to the present embodiment, it is possible to correctly sense the data stored in the ON memory cell over a range from a case of high power supply voltage to a case of low power supply voltage. In particular, it is possible to carry out the normal read operation even in the case of the low voltage power supply, which is impossible in the conventional technique. For example, a minimum power supply voltage of a flash ROM mounted on a conventional microcomputer is approximately 2.0 V. In recent years, a read operation with lower voltage (e.g. 1.5 V) is required. The present embodiment can meet such a requirement for the low power supply voltage.

Fourth Embodiment

Figure 13:
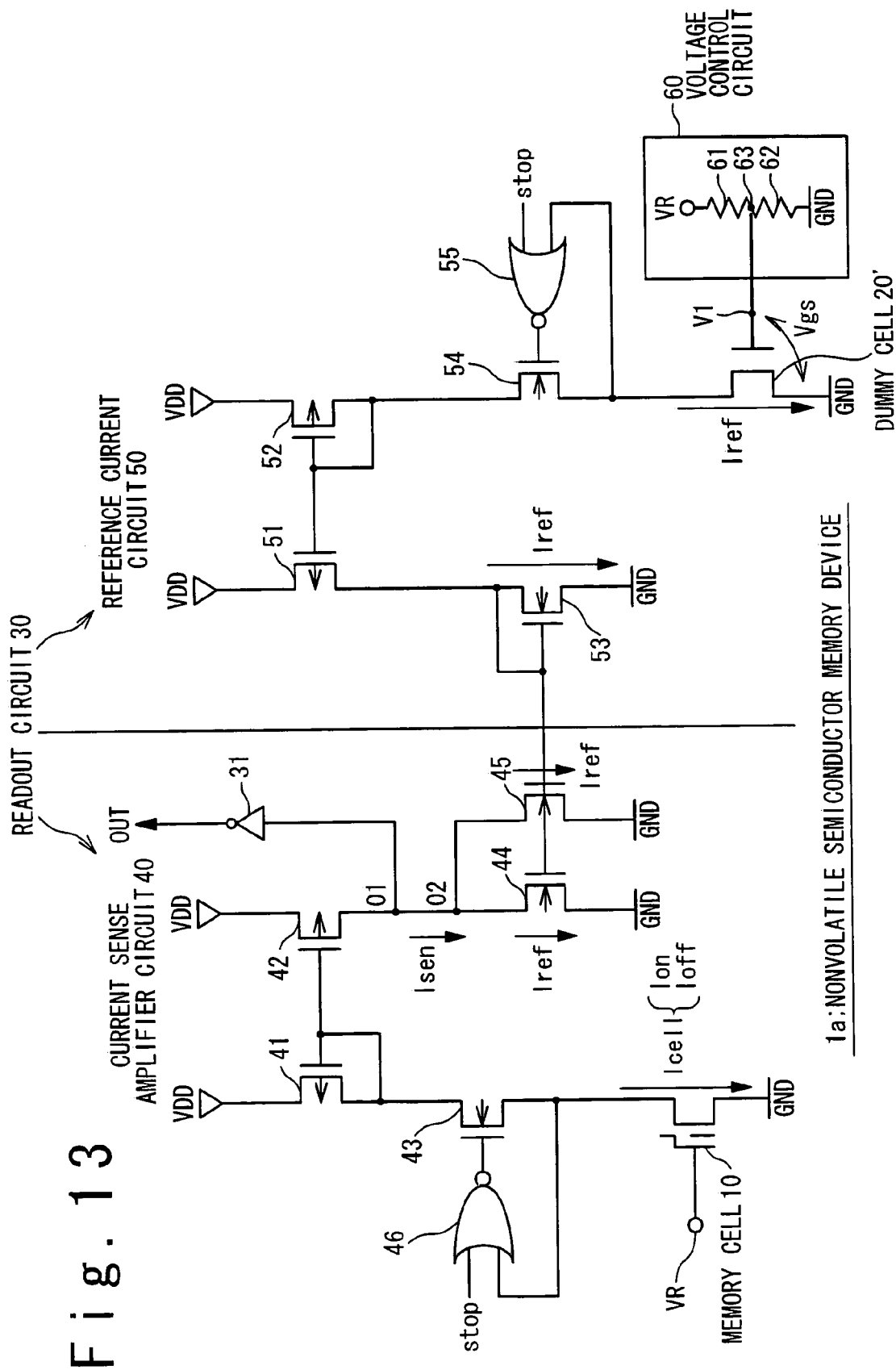
FIG. 13 is a circuit diagram showing a configuration of a nonvolatile semiconductor memory device according to a fourth embodiment.

FIG. 13 is a circuit diagram showing a configuration of a nonvolatile semiconductor memory device 1a according to a fourth embodiment of the present invention. In FIG. 13, the same reference numerals as in FIG. 5 are given to the same components as in FIG. 5, and description thereof is appropriately omitted.

In the nonvolatile semiconductor memory device 1a of the present embodiment, a single gate type N-channel enhanced transistor is used as a dummy cell 20'. A source of the dummy cell 20' is connected to the ground GND. The voltage control circuit 60 applies the first voltage V1 to a gate of the dummy cell 20'. A characteristic of the dummy cell 20' is the same as that of the dummy cell 20 in the foregoing embodiments in which the control gate 25 and the floating gate 23 are shorted with each other.

The voltage control circuit 60 sets the first voltage V1 to be lower than the read voltage VR. Consequently, the same effect as that in the second embodiment can be obtained. Also, as in the case of the first embodiment, the voltage control circuit 60 may set the first voltage V1 such that the dummy cell 20' operates in the "transition region" between the strong inversion region and the weak inversion region. In other words, the voltage control circuit 60 may set the first voltage V1 to a voltage in the vicinity of the threshold voltage of the dummy cell 20'. In this case, the same effect as that in the first embodiment can be obtained. Alternatively, the voltage control circuit 60 may set the first voltage V1 such that the equation (7) is satisfied. In this case, the same effect as that in the third embodiment can be obtained. Resistances R1 and R2 can be set appropriately.

Additional effect in the present embodiment is as follows. When a stacked gate structure as of the memory cell 10 is adopted as a structure of each dummy cell, wide variation can occur in manufacturing process due to complexity of the structure. This leads to variation in the currents flowing through dummy cells. If a plurality of cells having the same structure are arranged to surround the dummy cell for the purpose of reducing the manufacturing variation, a lay-out size is increased. According the present embodiment, an N-channel enhanced transistor, which is usually used in a logic circuit and so on, is adopted as the dummy cell 20'. Such a transistor is a basic MOS transistor and has a simple structure. Therefore, the manufacturing variations can be reduced as compared with the foregoing embodiments. As a result, the variation in the currents flowing through the dummy cell 20' is reduced.

Fifth Embodiment

Figure 14:
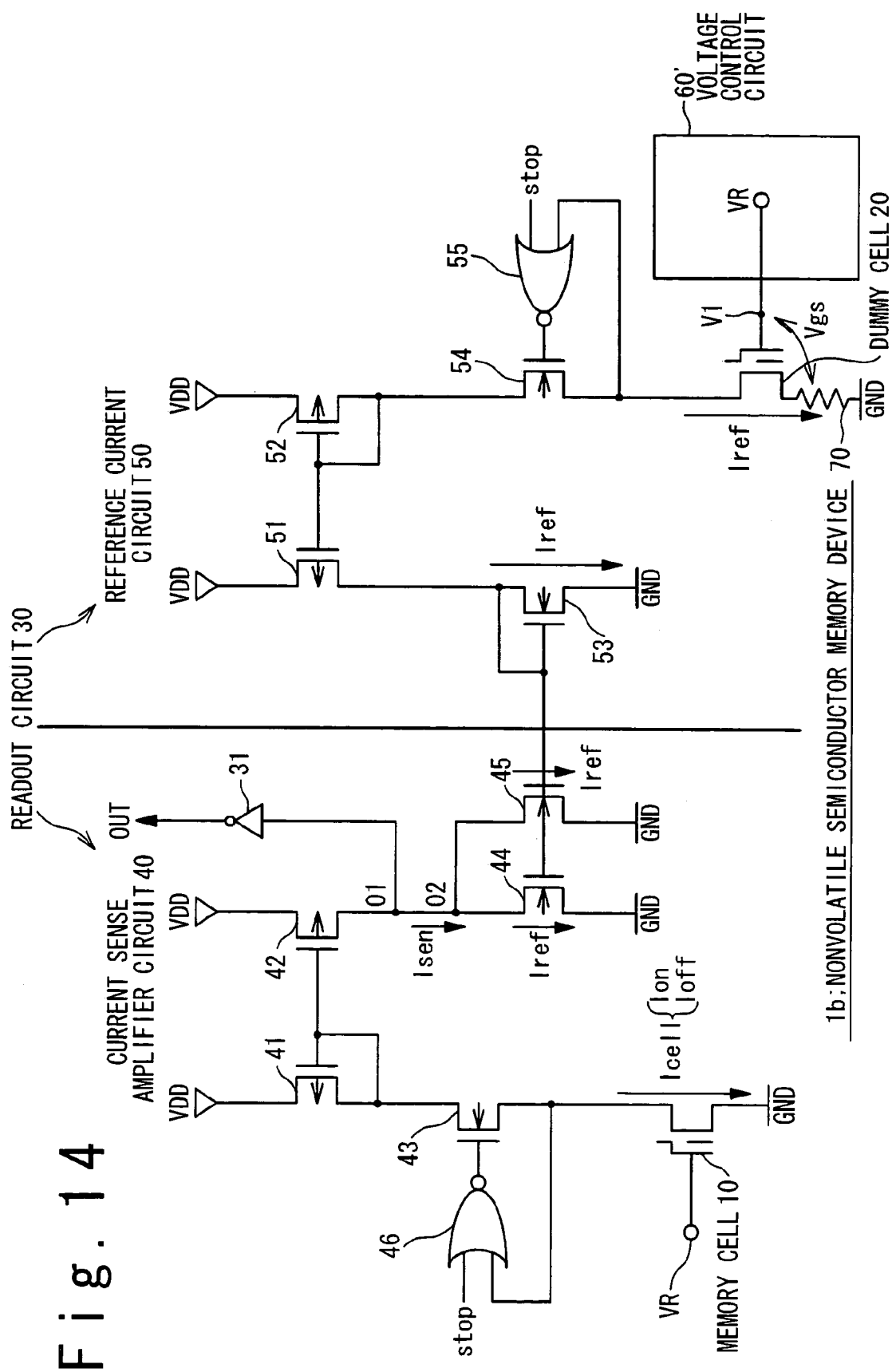
FIG. 14 is a circuit diagram showing a configuration of a nonvolatile semiconductor memory device according to a fifth embodiment.

FIG. 14 is a circuit diagram showing a configuration of a nonvolatile semiconductor memory device 1b according to the fifth embodiment of the present invention. In FIG. 14, the same reference numerals as in FIG. 5 are given to the same components as in FIG. 5, and description thereof is appropriately omitted.

In the nonvolatile semiconductor memory device 1b of the present embodiment, the source of the dummy cell 20 is not directly connected to the ground GND but is connected through a third resistance 70 to the ground GND. A voltage control circuit 60' outputs the read voltage VR as the first voltage V1 to the control gate 25 of the dummy cell 20. Therefore, at the time of a read operation, the same read voltage VR is applied to the control gate 15 of the memory cell 10 and the control gate 25 of the dummy cell 20. When a reference current is Iref and a resistance value of the third resistance 70 is Rs, a gate-source voltage Vgs of the dummy cell 20 in the present embodiment is given by the following equation:

$$V_{gs} = VR - I_{ref} R_s \quad (8)$$

Therefore, in the present embodiment as well, the gate-source voltage Vgs of the dummy cell 20 becomes smaller than the gate-source voltage (read voltage VR) of the memory cell 10. That is, the gate-source voltage Vgs is given by the following equation: Vgs=α*VR. Consequently, the same effect as that of the second embodiment can be obtained. Additionally, the resistance value Rs of the third resistance 70 may be set such that the dummy cell 20 operates in the "transition region" between the strong inversion region and the weak inversion region as in the first embodiment. In other words, the resistance value Rs of the third resistance 70 may be set such that the gate-source voltage Vgs expressed by the equation (8) is in the vicinity of the threshold voltage Vtd of the dummy cell 20. In this case, the same effect as that of the first embodiment can be obtained.

Alternatively, the parameter α may be set to satisfy the equation (7) as in the case of the third embodiment. In this case, the gate-source voltage Vgs of the dummy cell 20 is given by the following equation:

$$V_{gs} = \frac{C1}{C1+C2} VR \quad (9)$$

In this case, the following equation can be obtained by using the equations (8) and (9):

$$R_s = \frac{VR}{I_{ref}} \cdot \frac{C2}{C1+C2} \quad (10)$$

The resistance value Rs is set to satisfy the equation (10). In this case, the same effect as that of the third embodiment can be obtained. For example, when capacitances C1 and C2 are equal, the read voltage VR is 3.0 V, and the reference current is 5.0 μA, the resistance value Rs of the third resistance 70 is set to 300 kΩ. Also, a single gate type N-channel enhanced transistor may be used as the dummy cell 20' as in the case of the fourth embodiment.

Additional effect of the present embodiment is as follows. In the foregoing embodiments, a desired first voltage V1 is obtained with using the first resistance 61 and a second resistance 62. In that case, manufacturing variations and bias dependence of each resistance may cause deviation of a resistance division ratio from a desired design value. If the resistance division ratio deviates from the desired value, the first voltage V1 also deviates from a desired design value. According to the present embodiment, however, the read voltage VR is applied to the control gate 25 of the dummy cell 20. Therefore, it is not necessary to consider the resistance division ratio.

As described above, the temperature characteristic is improved according to the readout circuit 30 and the nonvolatile semiconductor memory devices (1, 1a, and 1b) having the readout circuit 30 of the present invention. In addition, the operating range is expanded.

It is apparent that the present invention is not limited to the above embodiment, and that may be modified and changed without departing from the scope and spirit of the invention.

What is claimed is:

1. A readout circuit comprising:
a sense amplifier circuit configured to sense a data stored in a memory cell transistor based on a current flowing through said memory cell transistor and a reference current flowing through a dummy cell transistor; and
a voltage control circuit configured to apply a first voltage to a gate of said dummy cell transistor in a read operation,
wherein said memory cell transistor has a control gate and a floating gate, and
said voltage control circuit sets said first voltage such that a voltage between said gate and a source of said dummy cell transistor is lower than a second voltage between said control gate and a source of said memory cell transistor,
wherein a capacitance between said control gate and said floating gate is C1,
a capacitance between said floating gate and a substrate surface is C2, and
said voltage control circuit sets said first voltage to be (C1/(C1+C2)) times said second voltage.

2. The readout circuit according to claim 1,
wherein said voltage control circuit sets said first voltage such that said dummy cell transistor operates in a transition region between a strong inversion region and a weak inversion region.

3. The readout circuit according to claim 1,
wherein said voltage control circuit sets said first voltage to a threshold voltage of said dummy cell transistor.

4. The readout circuit according to claim 1,
wherein said voltage control circuit includes:

a first resistance connected between an intermediate node and a terminal to which said second voltage is applied; and a second resistance connected between said intermediate node and a ground terminal, wherein said voltage control circuit sets a voltage of said intermediate node as said first voltage.

5. The readout circuit according to claim 4, wherein values of said first resistance and said second resistance are designed such that said dummy cell transistor operates in a transition region between a strong inversion region and a weak inversion region.

6. The readout circuit according to claim 4, wherein values of said first resistance and said second resistance are designed such that said first voltage is set to a threshold voltage of said dummy cell transistor.

7. The readout circuit according to claim 1, wherein said dummy cell transistor has a control gate and a floating gate which are shorted with each other, and said voltage control circuit applies said first voltage to said control gate of said dummy cell transistor.

8. The readout circuit according to claim 1, wherein said dummy cell transistor is a single-gate type enhanced transistor, and said voltage control circuit applies said first voltage to a gate of said enhanced transistor.

9. A readout circuit comprising:

a sense amplifier circuit configured to sense a data stored in a memory cell transistor based on a current flowing through said memory cell transistor and a reference current flowing through a dummy cell transistor; and a voltage control circuit configured to apply a first voltage to a gate of said dummy cell transistor in a read operation, wherein said memory cell transistor has a control gate and a floating gate, and said voltage control circuit sets said first voltage such that a voltage between said gate and a source of said dummy cell transistor is lower than a second voltage between said control gate and a source of said memory cell transistor, wherein said voltage control circuit includes:

a first resistance connected between an intermediate node and a terminal to which said second voltage is applied; and a second resistance connected between said intermediate node and a ground terminal, wherein said voltage control circuit sets a voltage of said intermediate node as said first voltage, and wherein a capacitance between said control gate and said floating gate is $C_1$, a capacitance between said floating gate and a substrate surface is $C_2$, a value of said first resistance is $R_1$, a value of said second resistance is $R_2$, and said $R_1$ and said $R_2$ are designed such that the following equation is satisfied:

$$C_1/(C_1+C_2) = R_2/(R_1+R_2).$$

10. A readout circuit comprising:

a sense amplifier circuit configured to sense a data stored in a memory cell transistor based on a current flowing through said memory cell transistor and a reference current flowing through a dummy cell transistor; and a voltage control circuit configured to apply a first voltage to a gate of said dummy cell transistor in a read operation, wherein said memory cell transistor has a control gate and a floating gate, and said voltage control circuit sets said first voltage such that a voltage between said gate and a source of said dummy cell transistor is lower than a second voltage between said control gate and a source of said memory cell transistor, wherein said source of said dummy cell transistor is connected to ground through a third resistance, and said voltage control circuit sets said first voltage to said second voltage.

11. The readout circuit according to claim 10, wherein a value of said third resistance is designed such that said dummy cell transistor operates in a transition region between a strong inversion region and a weak inversion region.

12. The readout circuit according to claim. 10, wherein a value of said third resistance is designed such that a voltage between said gate and said source of said dummy cell transistor is set to a threshold voltage of said dummy cell transistor.

13. The readout circuit according to claim 10, wherein a capacitance between said control gate and said floating gate is $C_1$, a capacitance between said floating gate and a substrate surface is $C_2$, said second voltage is VR, said reference current is Iref, and a value $R_3$ of said third resistance is given by the following equation:

$$R_3 = (VR/Iref)(C_2/C_1+C_2).$$

* * * * *